US012696452B2

(12) United States Patent
Lee et al.

(10) Patent No.: US 12,696,452 B2
(45) Date of Patent: Jul. 28, 2026

(54) VERTICAL MEMORY DEVICE AND METHOD OF MANUFACTURING THE SAME

(71) Applicant: SAMSUNG ELECTRONICS CO., LTD., Suwon-si (KR)

(72) Inventors: Sungbok Lee, Suwon-si (KR); Junhee Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 300 days.

(21) Appl. No.: 18/463,500

(22) Filed: Sep. 8, 2023

(65) Prior Publication Data

US 2024/0276723 A1 Aug. 15, 2024

(30) Foreign Application Priority Data

Feb. 15, 2023 (KR) ........................ 10-2023-0019716

(51) Int. Cl.
| | |
|---|---|
| *H10B 43/27* | (2023.01) |
| *H10B 41/10* | (2023.01) |
| *H10B 41/27* | (2023.01) |
| *H10B 43/10* | (2023.01) |
| *H10D 30/68* | (2025.01) |
| *H10D 30/69* | (2025.01) |

(52) U.S. Cl.
CPC ............. *H10B 43/27* (2023.02); *H10B 41/10* (2023.02); *H10B 41/27* (2023.02); *H10B 43/10* (2023.02); *H10D 30/6891* (2025.01); *H10D 30/694* (2025.01)

(58) Field of Classification Search
CPC .... H10D 30/68; H10D 30/6891; H10D 30/69; H10D 30/694; H10B 41/10; H10B 41/27; H10B 41/35; H10B 43/10; H10B 43/27; H10B 43/35; H10B 43/50
See application file for complete search history.

(56) References Cited

U.S. PATENT DOCUMENTS

| | | | |
|---|---|---|---|
| 9,620,514 B2 | 4/2017 | Kai et al. | |
| 10,903,232 B2 | 1/2021 | Tsutsumi | |
| 10,950,627 B1 | 3/2021 | Hinoue et al. | |
| 11,088,162 B2 | 8/2021 | Fujii et al. | |
| 2017/0062456 A1 | 3/2017 | Sugino et al. | |
| 2020/0098787 A1* | 3/2020 | Kaneko ................... | H10B 41/10 |
| 2021/0143172 A1* | 5/2021 | Yun ....................... | H10B 63/845 |

(Continued)

*Primary Examiner* — Brook Kebede
(74) *Attorney, Agent, or Firm* — Morgan, Lewis & Bockius LLP

(57) ABSTRACT

A vertical memory device includes a memory channel structure disposed on a substrate, a plurality of division layers disposed on the substrate and a gate electrode structure. The memory channel structure extends in a vertical direction substantially perpendicular to an upper surface of the substrate. The division layers contact the memory channel structure, respectively. The gate electrode structure contacts a sidewall of the memory channel structure, which may include a filling pattern, a channel disposed on a sidewall of the filling pattern and a charge storage structure disposed on an outer sidewall of the channel and sidewalls of the division layers, each of which extends through a portion of the charge storage structure and a portion of the channel. Each of the charge storage structure and the channel is divided into two parts by the division layers.

20 Claims, 37 Drawing Sheets

(56) References Cited

U.S. PATENT DOCUMENTS

| | | | |
|---|---|---|---|
| 2021/0265372 A1* | 8/2021 | Kanakamedala | ...... H10B 41/27 |
| 2021/0408036 A1 | 12/2021 | Lee et al. | |
| 2022/0005827 A1 | 1/2022 | Chang et al. | |
| 2022/0123013 A1 | 4/2022 | Gao et al. | |

\* cited by examiner

Figure 27:
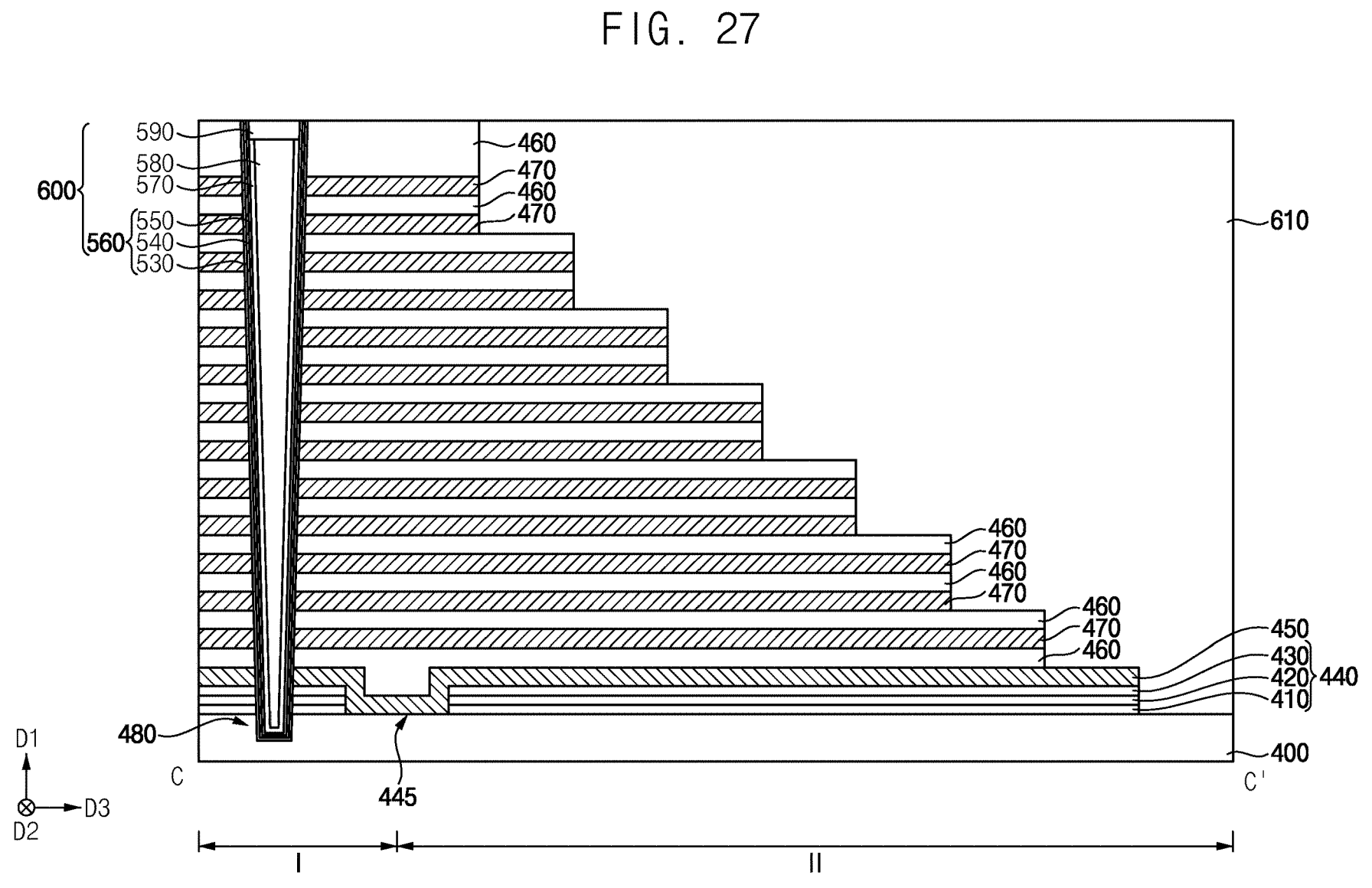

VERTICAL MEMORY DEVICE AND METHOD OF MANUFACTURING THE SAME

CROSS-REFERENCE TO RELATED APPLICATION

This application claims priority under 35 U.S.C. § 119 to Korean Patent Application No. 10-2023-0019716, filed on Feb. 15, 2023 in the Korean Intellectual Property Office, the disclosure of which is hereby incorporated by reference in its entirety.

TECHNICAL FIELD

Embodiments of the inventive concept relate to a semiconductor device, and more particularly, a vertical memory device.

DISCUSSION OF RELATED ART

In an electronic system that utilizes data storage, a high-capacity semiconductor device may be implemented to store large amounts of data. Various methods have been studied to increase the data storage capacity of such a semiconductor device. For example, a semiconductor device including memory cells that are three-dimensionally stacked may be utilized.

SUMMARY

Example embodiments provide a vertical memory device having improved electrical characteristics.

According to example embodiments, there is provided a vertical memory device. The vertical memory device may include a memory channel structure disposed on a substrate, a plurality of division layers disposed on the substrate and a gate electrode structure. The memory channel structure may extend in a vertical direction substantially perpendicular to an upper surface of the substrate. The division layers may contact the memory channel structure, respectively. The gate electrode structure may contact a sidewall of the memory channel structure, which may include a filling pattern, a channel disposed on a sidewall of the filling pattern and a charge storage structure disposed on an outer sidewall of the channel and sidewalls of the division layers, each of which may extend through a portion of the charge storage structure and a portion of the channel. Each of the charge storage structure and the channel is divided into two parts by the division layers.

According to example embodiments, there is provided a vertical memory device. The vertical memory device may include a memory channel structure disposed on a substrate, a division layer disposed on the substrate, and a gate electrode structure contacting a sidewall of the memory channel structure and a sidewall of the division layer. The memory channel structure, which may extend in a vertical direction substantially perpendicular to an upper surface of the substrate, may be disposed on the substrate and may include a filling pattern, a channel disposed on a sidewall of the filling pattern and a charge storage structure disposed on an outer sidewall of the channel. The charge storage structure may include a tunnel insulation pattern, a charge storage pattern and a blocking pattern sequentially stacked from the outer sidewall of the channel in a horizontal direction substantially parallel to the upper surface of the substrate. The division layer may extend through a portion of the blocking pattern and contact the charge storage pattern, which may include an air gap including air at a portion of the charge storage pattern contacting the division layer.

According to example embodiments, there is provided a semiconductor device. The vertical memory device may include a memory channel structure disposed on a substrate, a plurality of division layers disposed on the substrate and a gate electrode structure contacting a sidewall of the memory channel structure and sidewalls of the division layers. The memory channel structure may extend in a vertical direction substantially perpendicular to an upper surface of the substrate. The charge storage structure may include a tunnel insulation pattern, a charge storage pattern and a blocking pattern sequentially stacked from an outer sidewall of the channel in a horizontal direction substantially parallel to the upper surface of the substrate. Each of the division layers may extend through a portion of the blocking pattern, which may be divided into two parts by the division layers, and may contact the memory channel structure, which may include a filling pattern, a channel on a sidewall of the filling pattern and a charge storage structure on an outer sidewall of the channel, and may have a shape of a circle or an ellipse in a plan view.

In a vertical memory device in accordance with example embodiments, a gate electrode surrounding a single memory channel structure may be divided, or a charge storage structure or a channel included in the memory channel structure may be divided, so that the vertical memory device may have a multi-bit level cell (MLC) structure.

BRIEF DESCRIPTION OF THE DRAWINGS

The above and other features of the inventive concept will become more apparent by describing in detail embodiments thereof with reference to the accompanying drawings.

FIG. 1 is a plan view illustrating a vertical memory device in accordance with example embodiments.

FIGS. 3 to 8 are plan views and cross-sectional views illustrating a method of manufacturing a vertical memory device in accordance with example embodiments.

FIGS. 11 and 12 are a plan view and a cross-sectional view illustrating a vertical memory device in accordance with example embodiments, respectively.

FIGS. 14A, 14B and 15 are a plan views and a cross-sectional view illustrating a vertical memory device in accordance with example embodiments.

FIGS. 22 to 35 are plan views and cross-sectional views illustrating a method of manufacturing a vertical memory device in accordance with example embodiments.

DETAILED DESCRIPTION

Figure 2A:
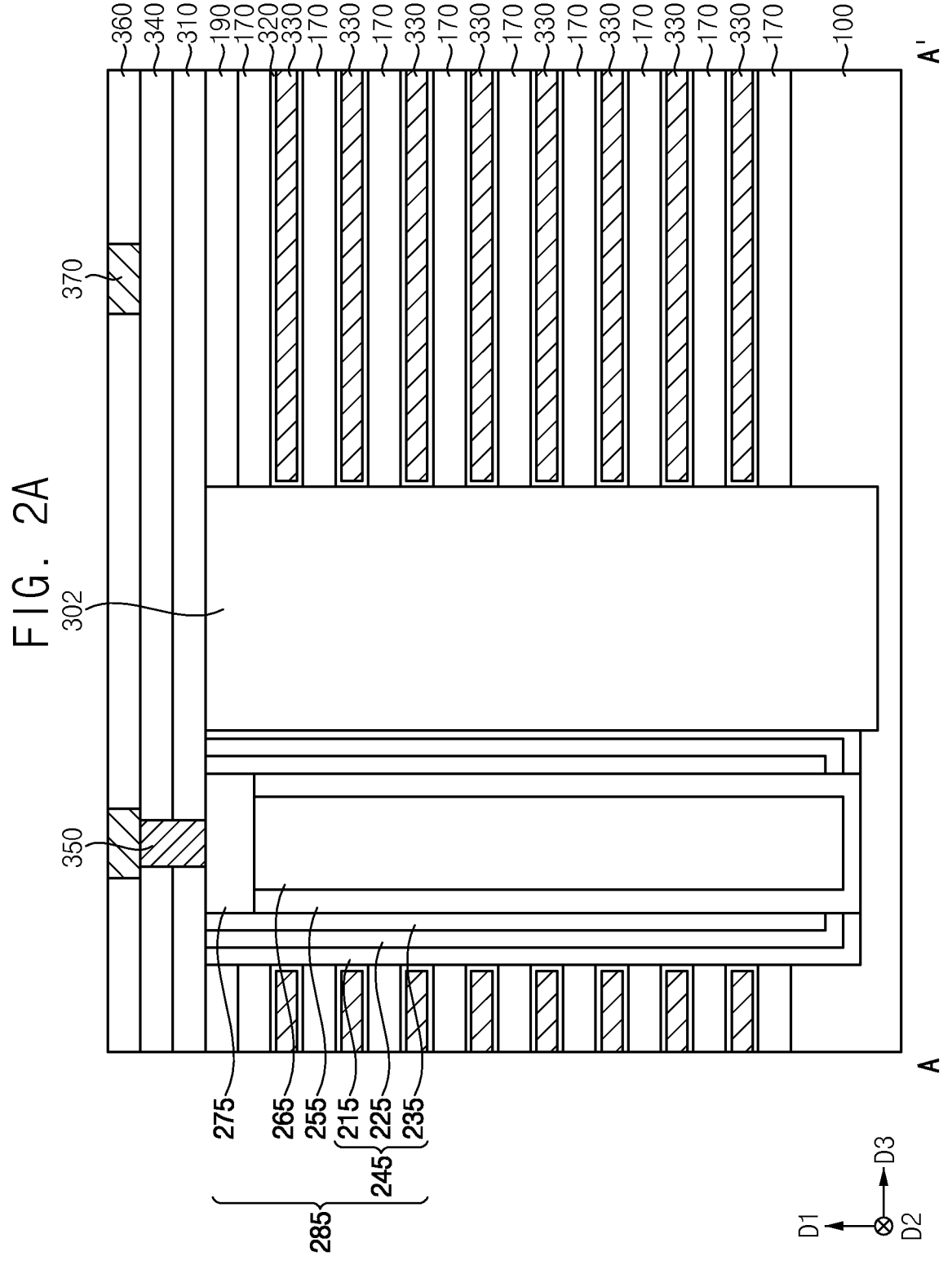
FIGS. 2A and 2B are cross-sectional views taken along line A-A' of FIG. 1, respectively.

The above and other features of the inventive concept will become more apparent by describing in detail embodiments thereof with reference to the accompanying drawings.

It should be understood that descriptions of features or aspects within each example embodiment should typically be considered as available for other similar features or aspects in other example embodiments, unless the context clearly indicates otherwise.

As used herein, the singular forms "a", "an" and "the" are intended to include the plural forms as well, unless the context clearly indicates otherwise.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below.

It will be understood that when a component such as a film, a region, a layer, etc., is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words used to describe the relationships between components should be interpreted in a like fashion.

Herein, when two or more elements or values are described as being substantially the same as or about equal to each other, it is to be understood that the elements or values are identical to each other, the elements or values are equal to each other within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations as understood by one of the ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

It will be further understood that when two components or directions are described as extending substantially parallel or perpendicular to each other, the two components or directions extend exactly parallel or perpendicular to each other, or extend approximately parallel or perpendicular to each other within a measurement error as would be understood by a person having ordinary skill in the art.

It will be understood that, although the terms "first," "second," "third", etc. may be used herein to describe various materials, layers, regions, pads, electrodes, patterns, structure and/or processes, these various materials, layers, regions, pads, electrodes, patterns, structure and/or processes should not be limited by these terms. These terms are only used to distinguish one material, layer, region, pad, electrode, pattern, structure or process from another material, layer, region, pad, electrode, pattern, structure or process. Thus, "first", "second", "third", etc. may be used selectively or interchangeably for each material, layer, region, electrode, pad, pattern, structure or process respectively.

Hereinafter, a vertical direction substantially perpendicular to an upper surface of a substrate may be referred to as a first direction D1, and two directions crossing each other among horizontal directions substantially parallel to the upper surface of the substrate may be referred to as second and third directions D2 and D3, respectively. Additionally, two directions among the horizontal directions, which may have an acute angle with respect to each of the first and second directions D2 and D3 and may be substantially perpendicular to each other, may be referred to as fourth and fifth directions D4 and D5, respectively.

Figure 1:
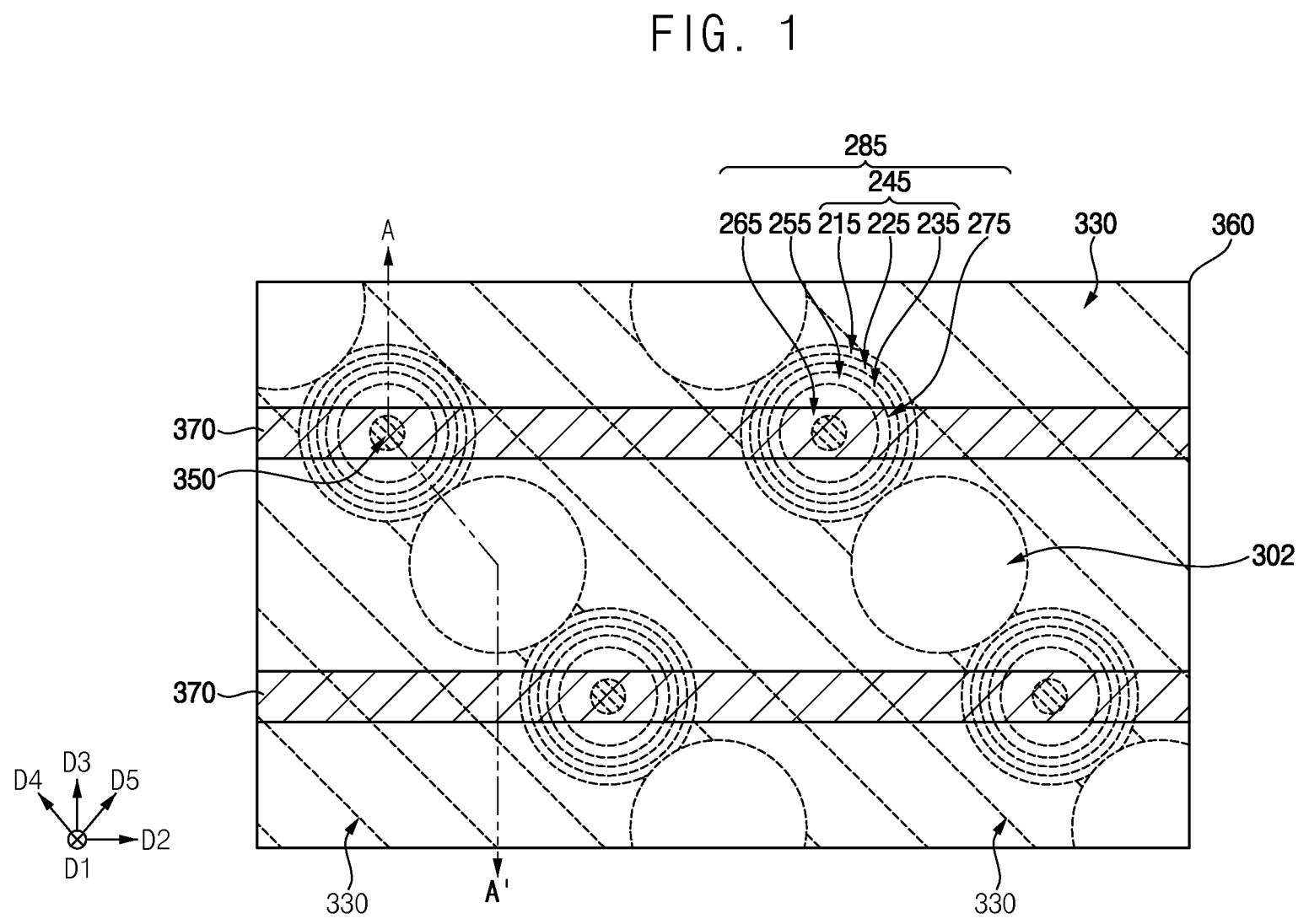
Figure 2B:
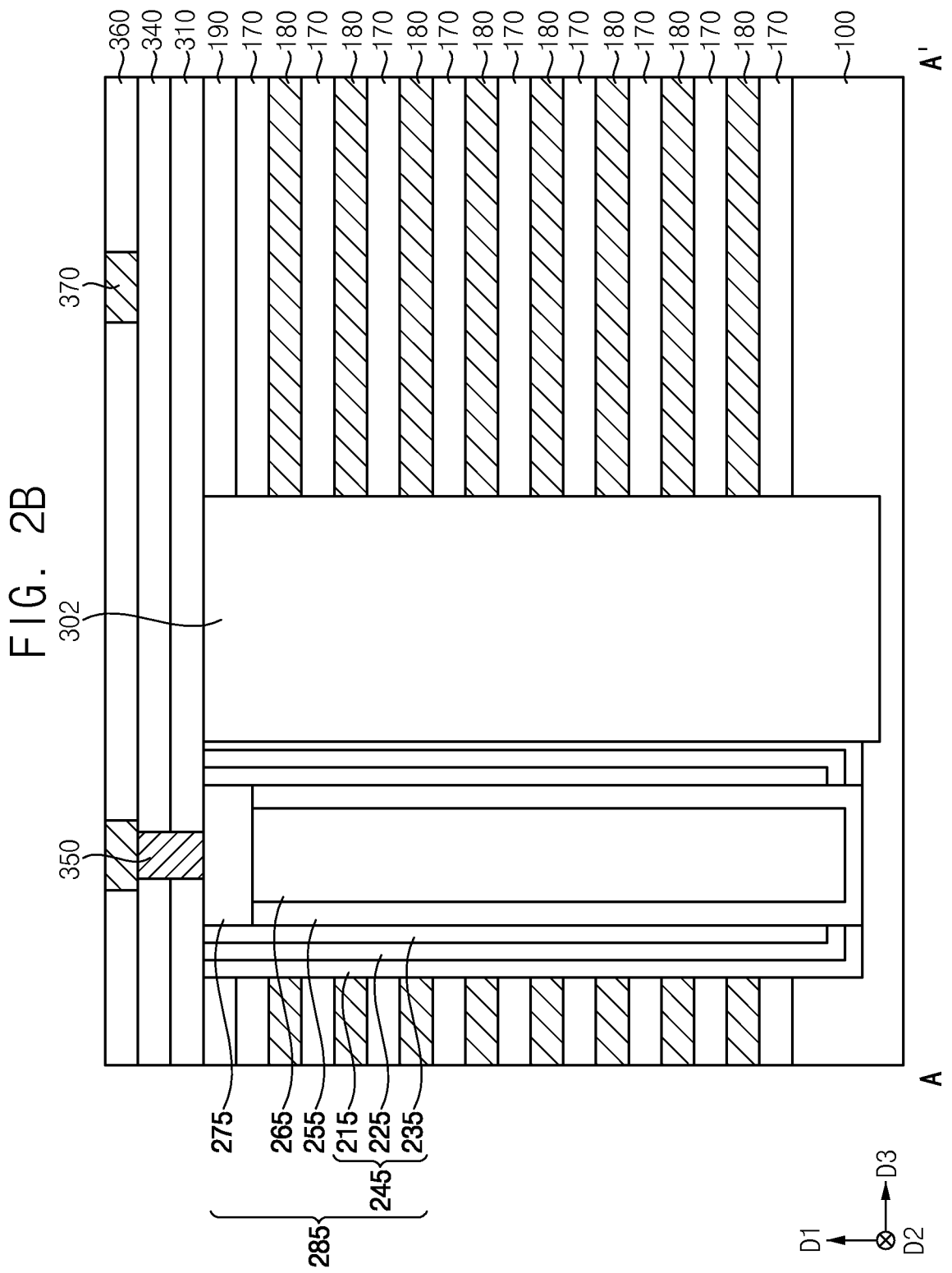

FIG. 1 is a plan view illustrating a vertical memory device in accordance with example embodiments, and each of FIGS. 2A and 2B is a cross-sectional view taken along line A-A' of FIG. 1.

Referring to FIGS. 1 and 2A, the vertical memory device may include a first memory channel structure 285, a first division layer 302 and a first gate electrode 330 disposed on a first substrate 100.

The vertical memory device may further include a first insulation layer 170, a second blocking pattern 320, a first contact plug 350, a bit line 370, and first to fourth insulating interlayers 190, 310, 340 and 360.

The first substrate 100 may include a semiconductor material, e.g., silicon, germanium and silicon-germanium, or a III-V compound, e.g., GaP, GaAs, GaSb, etc. In example embodiments, the first substrate 100 may be a silicon-on-insulator (SOI) substrate or a germanium-on-insulator (GOI) substrate.

The first memory channel structure 285 may extend in the first direction D1 on the first substrate 100. In an example embodiment, the first memory channel structure 285 may extend through an upper portion of the first substrate 100.

The first memory channel structure 285 may have various shapes, e.g., a shape of a circle, an ellipse, a polygon, a polygon with rounded vertices, etc., in a plan view. In example embodiments, a plurality of first memory channel structures 285 may be spaced apart from each other in the second and third directions D2 and D3 to define a first memory channel structure array.

In example embodiments, the first memory channel structure array may include a plurality of first memory channel structure rows, each of which may include a plurality of first memory channel structures 285 spaced apart from each other in the second direction D2, spaced apart from each other in the third direction D3. The first memory channel structure array may include a plurality of first memory channel structure columns, each of which may include a plurality of first memory channel structures 285 spaced apart from each other in the fourth direction D4, spaced apart from each other in the second direction D2.

The first memory channel structure 285 may have a first filling pattern 265 having a pillar shape extending in the first direction D1, a first channel 255 having a cup shape covering a sidewall and a lower surface of the first filling pattern 265 and contacting the upper surface of the first substrate 100, a first capping pattern 275 disposed on the first filling pattern 265 and the first channel 255, and a first charge storage structure 245 having a cylindrical shape covering an outer sidewall of the first channel 255 and a sidewall of the first capping pattern 275. The first charge storage structure 245 may include a first tunnel insulation pattern 235, a first charge storage pattern 225 and a first blocking pattern 215 sequentially stacked in the horizontal direction from the outer sidewall of the first channel 255 and the sidewall of the first capping pattern 275.

The first filling pattern 265 may include an oxide, e.g., silicon oxide, the first channel 255 may include, e.g., polysilicon, and the first capping pattern 275 may include, e.g., polysilicon doped with impurities, a metal, a metal nitride, etc.

The first tunnel insulation pattern 235 may include an oxide, e.g., silicon oxide or an oxynitride, e.g., silicon oxynitride. In an example embodiment, the first tunnel insulation pattern 235 may include a first layer including silicon oxide and a second layer including silicon oxynitride.

The first blocking pattern 215 may include an oxide, e.g., silicon oxide, and the first charge storage pattern 225 may include a nitride, e.g., silicon nitride.

The first division layer 302 may have a shape of a pillar extending in the first direction D1 on the first substrate 100. In an example embodiment, the first division layer 302 may extend through the upper portion of the first substrate 100, and thus, a lower surface of the first division layer 302 may be disposed lower than the upper surface of the first substrate 100. Alternatively, the lower surface of the first division layer 302 may be disposed higher than the upper surface of the first substrate 100, however, the lower surface of the first division layer 302 may be disposed lower than an upper surface of a lowermost one of the first insulation layers 170.

In example embodiments, the first division layer 302 may partially contact an outer sidewall of each of ones of the first charge storage structures 245 neighboring in the fourth direction D4 in each of the first memory channel structure columns, for example, an outer sidewall of each of ones of the first blocking patterns 215 neighboring in the fourth direction D4.

In example embodiments, the first division layer 302 may have various shapes of, e.g., a circle, an ellipse, a polygon, a polygon with rounded vertices, etc., in a plan view, and may include an oxide, e.g., silicon oxide.

In example embodiments, a plurality of first division layers 302 may be spaced apart from each other in the second and third directions D2 and D3 to define a first division layer array.

In example embodiments, the first division layer array may include a plurality of first division layer rows, each of which may include a plurality of first division layers 302 spaced apart from each other in the second direction D2, spaced apart from each other in the third direction D3. In addition, the first division layer array may include a plurality of first division layer columns, each of which may include a plurality of first division layers 302 spaced apart from each other in the fourth direction D4, spaced apart from each other in the second direction D2.

A plurality of first gate electrodes 330 may be spaced apart from each other in the first direction D1 on the substrate 100 to form a first gate electrode structure. The first insulation layer 170 may be disposed between ones of the first gate electrodes 330 disposed adjacent to each other in the first direction D1. The first insulation layer 170 may include an oxide, e.g., silicon oxide.

In example embodiments, the first gate electrode structure may extend in the fourth direction D4, and a plurality of first gate electrode structures may be spaced apart from each other in the second direction D2. In example embodiments, the first memory channel structures 285 included in the first memory channel structure column and the first division layers 302 included in the first division layer columns may be disposed between ones of the first gate electrode structures disposed adjacent to each other in the second direction D2.

In example embodiments, the first gate electrodes 330 included in each of the first gate electrode structures and sequentially stacked in the first direction D1 may serve as a ground select line (GSL), a word line and a string select line (SSL), respectively, depending on positions thereof. In an example embodiment, one of the first gate electrodes 330 disposed at a lowermost level in the first gate electrode structure may serve as the GSL, one of the first gate electrodes 330 disposed at an uppermost level and one of the first gate electrodes 330 disposed at a second level from above in the first gate electrode structure may serve as the SSL, and ones of the first gate electrodes 330 disposed at a plurality of levels between the GSL and the SSL may serve as the word line.

Each of the first gate electrodes 330 may include a first gate conductive pattern and a first gate barrier pattern covering upper and lower surfaces and a portion of a sidewall of the first gate conductive pattern. The first gate conductive pattern may include a metal having a low electrical resistance, e.g., tungsten, titanium, tantalum, platinum, etc., and the first gate barrier pattern may include a metal nitride, e.g., titanium nitride, tantalum nitride, etc.

Upper and lower surfaces and a sidewall facing the first memory channel structure 285 of each of the first gate electrodes 330 may be covered by the second blocking pattern 320. The second blocking pattern 320 may include a metal oxide, e.g., aluminum oxide or hafnium oxide.

The first insulating interlayer 190 may be disposed on an uppermost one of the first insulation layers 170, the second insulating interlayer 310 may be disposed on the first insulating interlayer 190, the first memory channel structure 285 and the first division layer 302, and the third and fourth insulating interlayers 340 and 360 may be sequentially stacked on the second insulating interlayer 310. Each of the first to fourth insulating interlayers 190, 310, 340 and 360 may include an oxide, e.g., silicon oxide or a low-k dielectric material.

The first contact plug 350 may extend through the second and third insulating interlayers 310 and 340, and contact an upper surface of the first capping pattern 275. The bit line 370 may extend in the second direction D2, and may contact the first contact plugs 350 under the bit line 370. In example embodiments, a plurality of bit lines 370 may be spaced apart from each other in the third direction D3.

Referring to FIG. 2B, a first sacrificial layer 180 may be disposed instead of each of the first gate electrodes 330 and the second blocking pattern 320. The first sacrificial layer 180 may include, as described below with reference to FIGS. 3 to 8, for example, polysilicon doped with impurities instead of an insulating material such as silicon nitride. Thus, the first sacrificial layer 180 may serve as a gate electrode, instead of being replaced by the first gate electrode 330.

As described above, in the vertical memory device, the first gate electrode structure may extend in the fourth direction D4, and a plurality of the first gate electrode structures may be spaced apart from each other in the second direction D2 by the first memory channel structures 285 included in the first memory channel structure column and the first division layers 302 included in the first division layer column corresponding to the first memory channel structures.

Accordingly, when compared to a vertical memory device including, for example, a single gate electrode structure surrounding a single first memory channel structure 285, the vertical memory device in accordance with example embodiments may include two first memory electrode structures respectively disposed at opposite sides in the fifth direction D5 of a single first memory channel structure 285, so that the vertical memory device may have a multi-bit level cell (MLC) structure.

Figure 3:
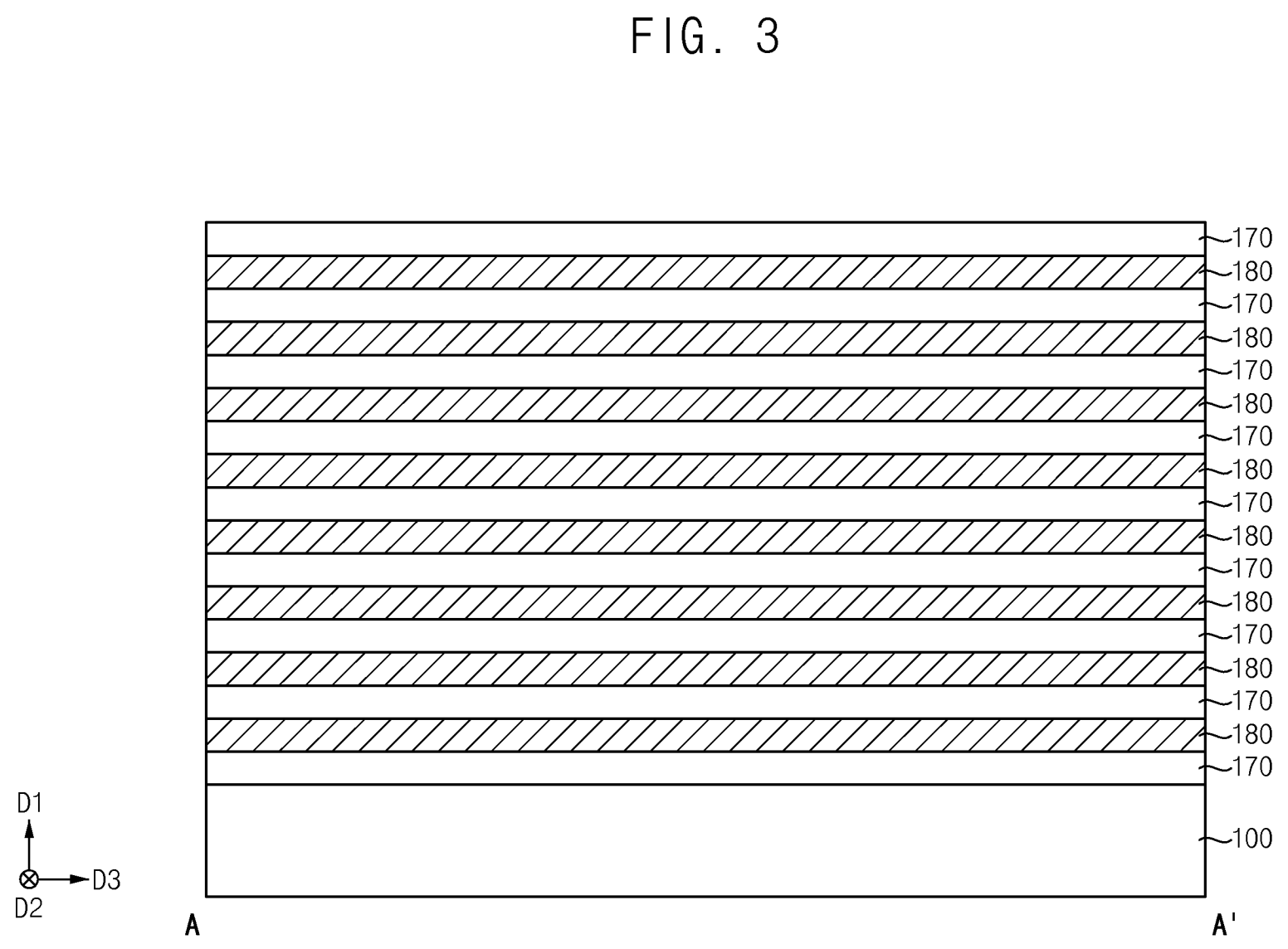
Figure 4:
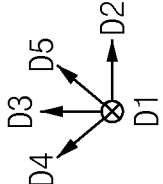
Figure 6:
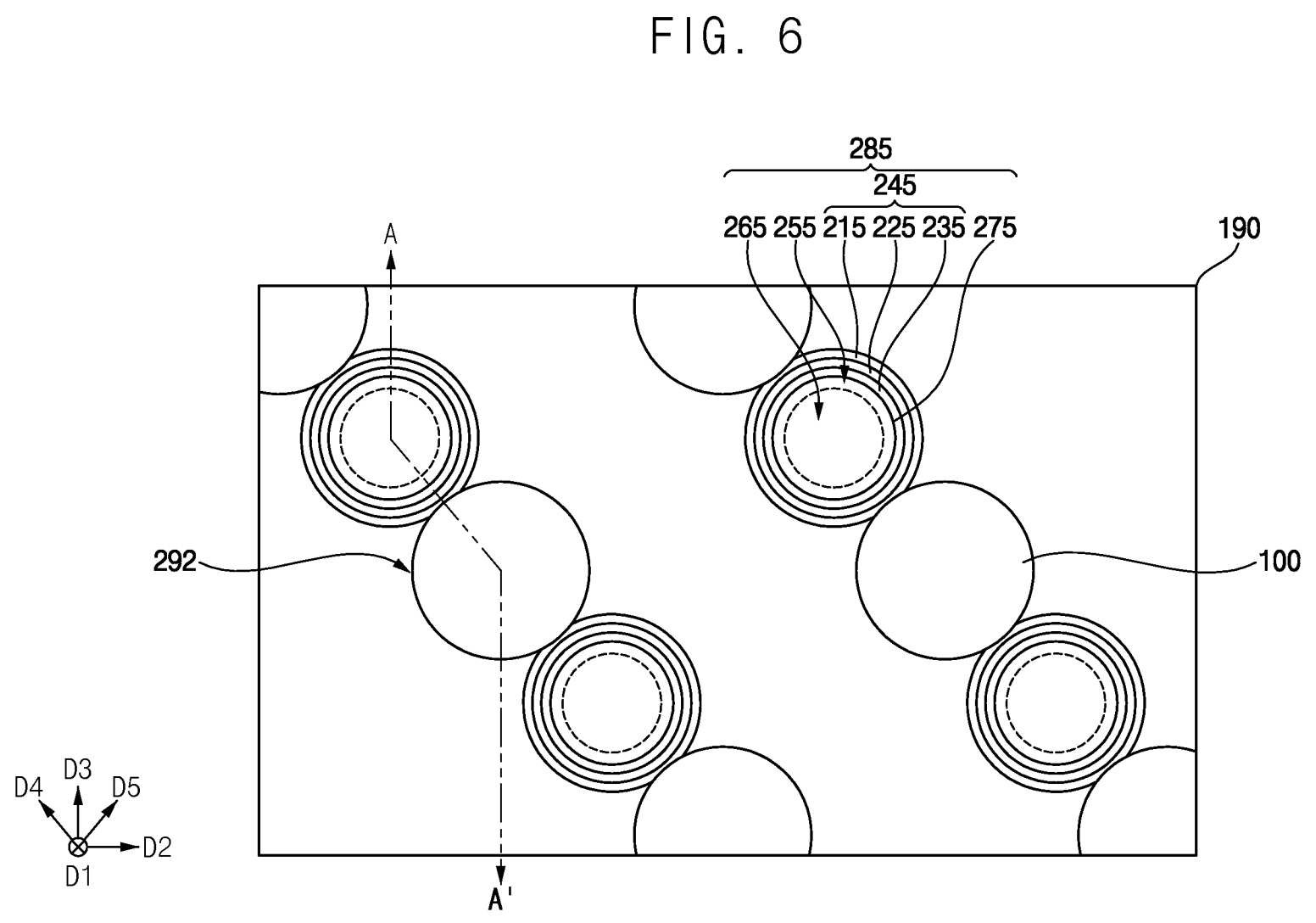

FIGS. 3 to 8 are plan views and cross-sectional views illustrating a method of manufacturing a vertical memory device in accordance with example embodiments. For example, FIGS. 4 and 6 are plan views, and FIGS. 3, 5 and 7-8 are cross-sectional views taken along lines A-A' of corresponding plan views, respectively.

Referring to FIG. 3, a first insulation layer 170 and a first sacrificial layer 180 may be alternately and repeatedly stacked on a first substrate 100 in a first direction D1, and thus, a first mold layer may be formed on the substrate 100.

The first insulation layer 170 may include, for example, an oxide such as silicon oxide, and first sacrificial layer 180 may include a material having a high etching selectivity with respect to the first insulation layer 170, for example, a nitride such as silicon nitride.

Figure 5:
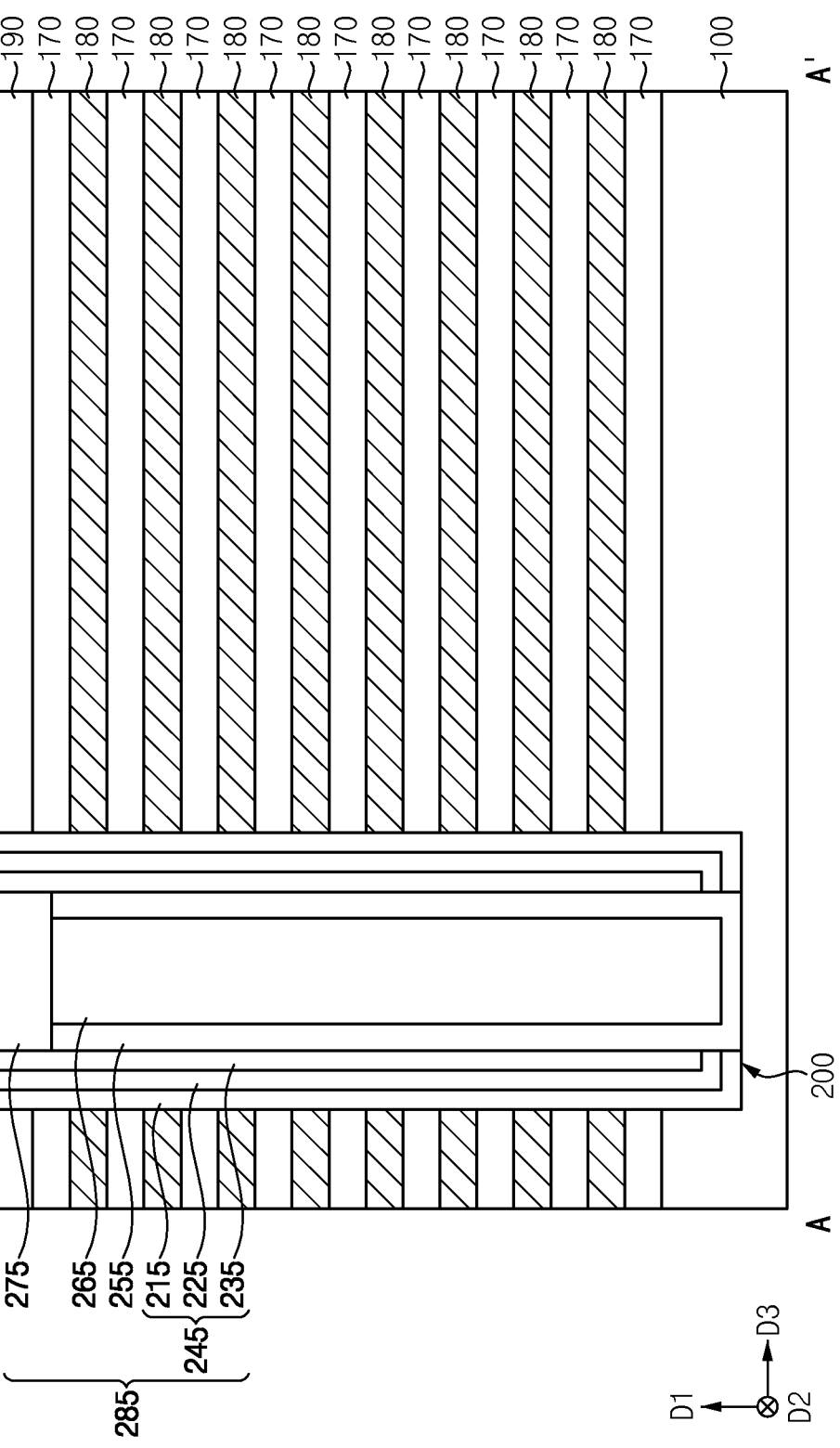

Referring to FIGS. 4 and 5, after a first insulating interlayer 190 is formed on the first mold layer, a first hole 200 may be formed through the first insulating interlayer 190 and the first mold layer to expose an upper surface of the first substrate 100 by, for example, a dry etching process.

In example embodiments, the dry etching process may be performed until the first hole 200 exposes the upper surface of the first substrate 100, and further, the first hole 200 may extend through an upper portion of the first substrate 100. A plurality of first holes 200 may be spaced apart from each other in the second and third directions D2 and D3 to define a first hole array. The first hole array may include a plurality of first hole rows spaced apart from each other in the third direction D3, and each of the first hole rows may include a plurality of first holes 200 spaced apart from each other in the second direction D2.

In example embodiments, ones of the first holes 200 respectively included in the first hole rows disposed adjacent to each other in the third direction D3 may be arranged in the fourth direction D4. Thus, ones of the first holes 200 spaced apart from each other in the fourth direction D4 may define a first hole column, and the first hole array may include a plurality of first hole columns spaced apart from each other in the second direction D2.

In an example embodiment, ones of the first holes 200 respectively included in the first hole rows disposed adjacent to each other in the third direction D3 do not overlap each other in the third direction D3, however embodiments of the inventive concept are not limited thereto.

In example embodiments, the first hole 200 may have a shape of, e.g., a circle, an ellipse, a polygon, a polygon with rounded vertices, etc., in a plan view, however, embodiments of the inventive concept are not limited thereto.

A first charge storage layer structure may be formed on a sidewall of the first hole 200, the exposed upper surface of the substrate 100 and an upper surface of the first insulating interlayer 190, and an anisotropic etching process may be performed on the first charge storage layer structure to form a first charge storage structure 245 on the sidewall of the first hole 200.

A first channel layer may be formed on the upper surface of the first substrate 100, an inner sidewall and an upper surface of the first charge storage structure 245, and the upper surface of the first insulating interlayer 190, and a first filling layer may be formed to fill the first hole 200.

The first filling layer and the first channel layer may be planarized until the upper surface of the first insulating interlayer 190 is exposed to form a first filling pattern 265 and a first channel 255, respectively. Accordingly, the first filling pattern 265, the first channel 255 covering a sidewall and a lower surface of the first filling pattern 265, and the first charge storage structure 245 covering an outer sidewall of the first channel 255 may be formed in the first hole 200. The first charge storage structure 245 may include a first blocking pattern 215, a first charge storage pattern 225 and a first tunnel insulation pattern 235 sequentially stacked from the sidewall of the first hole 200.

Upper portions of the first filling pattern 265 and the first channel 255 may be removed to form a first recess, a first capping layer may be formed on the first filling pattern 265, the first channel 255, the first charge storage structure 245 and the first insulating interlayer 190 to fill the first recess, and the first capping layer may be planarized until the upper surface of the first insulating interlayer 190 is exposed to form a first capping pattern 275 contacting an inner upper sidewall of the first charge storage structure 245 on the first filling pattern 265 and the first channel 255.

The first charge storage structure 245, the first channel 255, the first filling pattern 265 and the first capping pattern 275 in each of the first holes 200 may collectively form a first memory channel structure 285. As the first holes 200, in which the first memory channel structures 285 are respectively formed, define the first hole array, the first memory channel structures 285 disposed in the first holes 200, respectively, may correspondingly define a first memory channel structure array.

The first memory channel structure array may include a plurality of first memory channel structure rows spaced apart from each other in the third direction D3, and each of the first memory channel structure rows may include a plurality of first memory channel structures 285 spaced apart from each other in the second direction D2. Additionally, the first memory channel structure array may include a plurality of first memory channel structure columns spaced apart from each other in the second direction D2, and each of the first memory channel structure columns may include a plurality of first memory channel structures 285 spaced apart from each other in the fourth direction D4.

Figure 7:
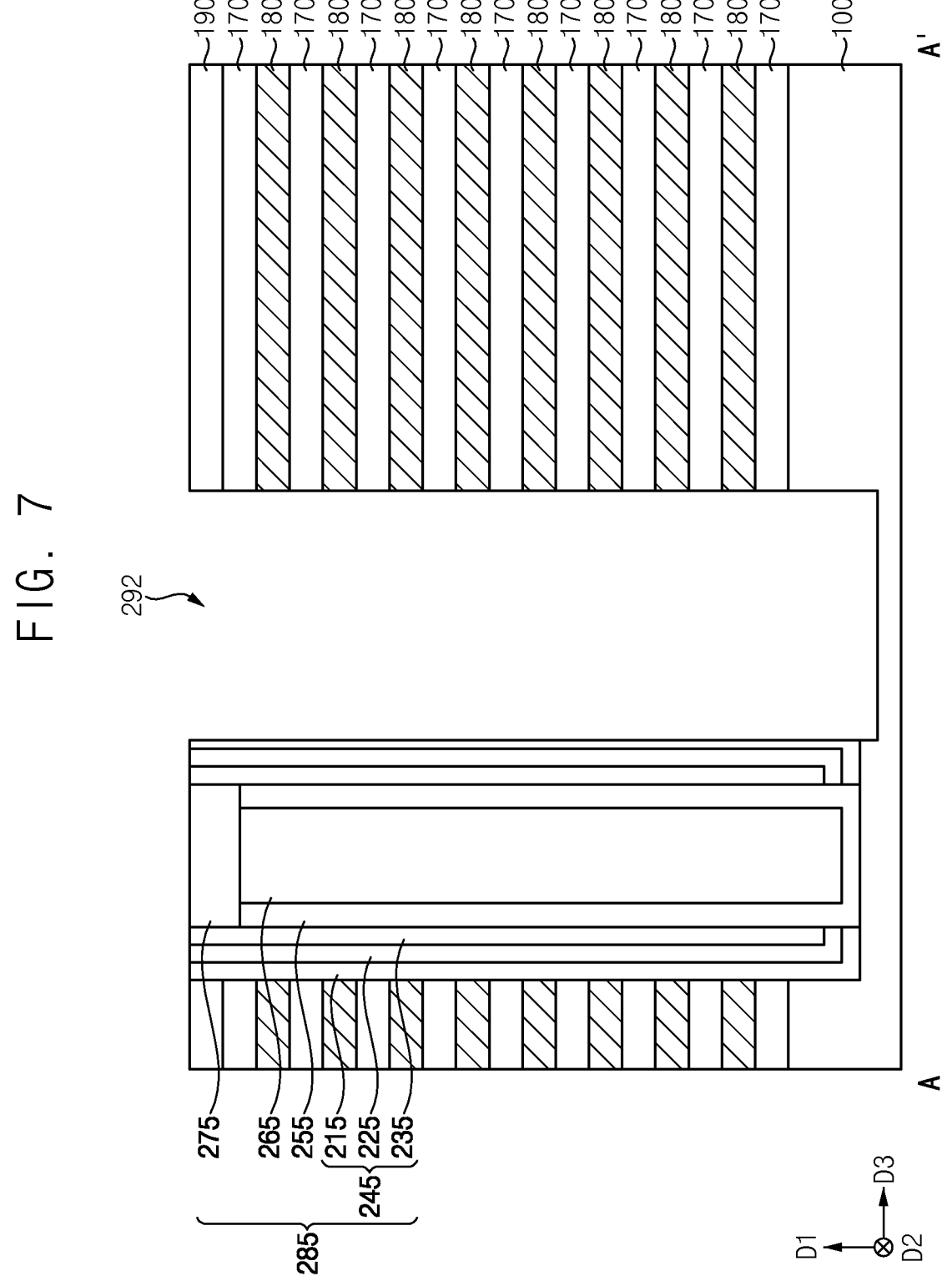

Referring to FIGS. 6 and 7, a second hole 292 may be formed through the first insulating interlayer 190 and the first mold layer by, e.g., a dry etching process, to expose the upper surface of the first substrate 100.

In example embodiments, the dry etching process may be performed until the second hole 292 exposes the upper surface of the first substrate 100, and further, the second hole 292 may be formed to extend through the upper portion of the first substrate 100. However, embodiments of the inventive concept are not limited thereto. For example, in an example embodiment, the second hole 292 does not expose the upper surface of the first substrate 100. In this case, the second hole 292 may extend through at least a lowermost one of the first sacrificial layers 180, and thus, a bottom of the second hole 292 may be disposed lower than a lower surface of the lowermost one of the first sacrificial layers 180.

In example embodiments, the second hole 292 may extend through a portion of the first mold layer between ones of the first memory channels structures 285 neighboring in the fourth direction D4 in each of the first memory channel structure columns to partially expose a sidewall of the first charge storage structure 245 included in each of the ones of the first memory channel structures 285. The second hole 292 may partially extend through an outer lateral portion of the first charge storage structure 245, for example, an outer lateral portion of the first blocking pattern 215.

In example embodiments, a plurality of second holes 292 may be spaced apart from each other in the fourth direction D4 to form a second hole column, and a plurality of second hole columns may be spaced apart from each other in the second direction D2 to define a second hole array.

Accordingly, the first mold layer may be divided in the fifth direction D5 by ones of the first memory channel structures 285 spaced apart from each other in the fourth direction D4 in the first memory channel structure column and ones of the second holes 292 spaced apart from each other in the fourth direction D4 in the second hole column corresponding to the first memory channel structure 285. Additionally, a plurality of first memory channel structure columns may be spaced apart from each other in the second direction D2 and a plurality of second hole columns may be spaced apart from each other in the second direction D2. Accordingly, the first mold layer may be divided into a plurality of parts in the second direction D2.

In example embodiments, the second hole 292 may have a shape of, e.g., a circle, an ellipse, a polygon, a polygon with rounded vertices, etc., in a plan view.

Figure 8:
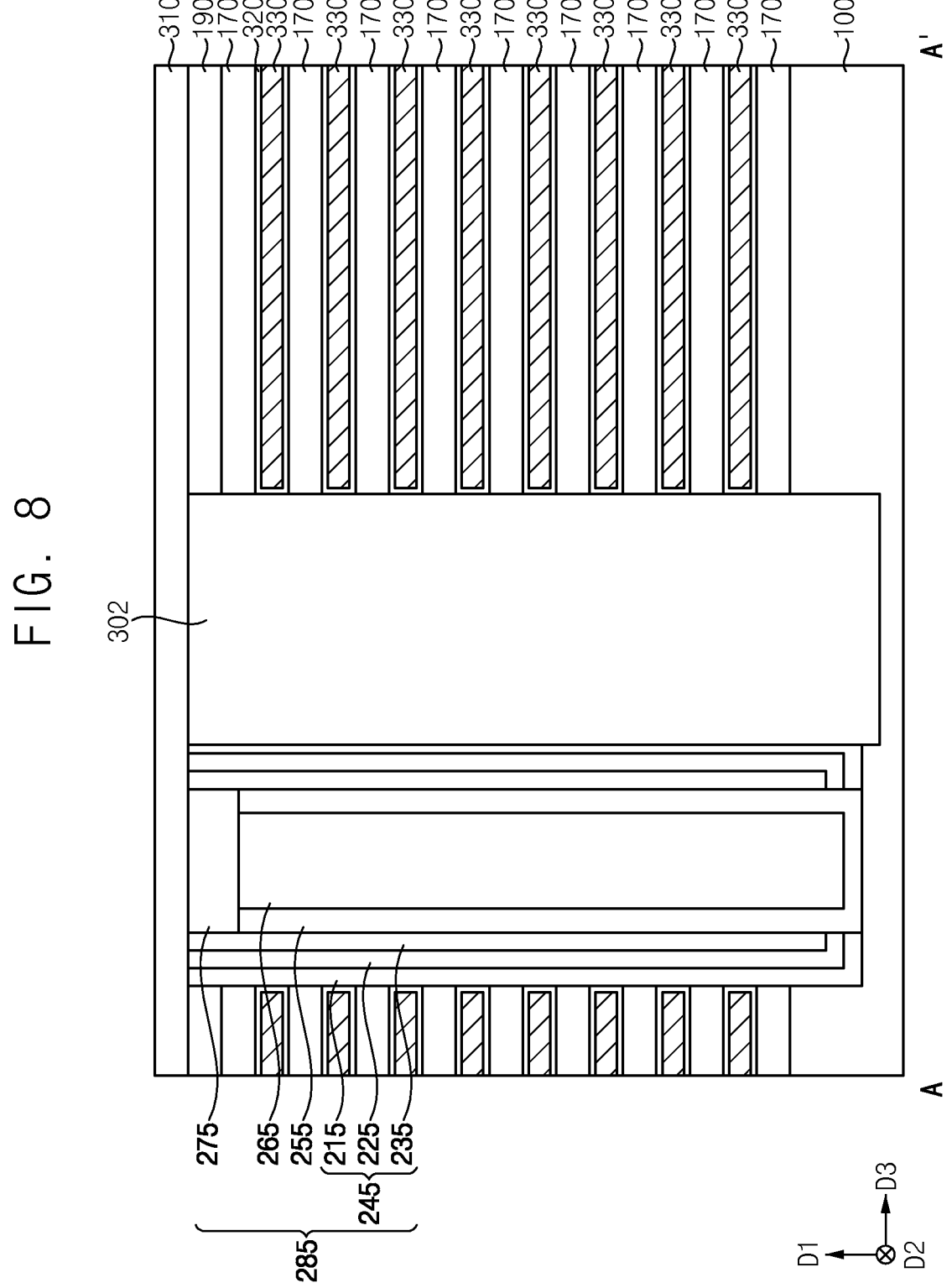

Referring to FIG. 8, after the first division layer 302 is formed on the first substrate 100 to fill the second hole 292, a second insulating interlayer 310 may be formed on the first insulating interlayer 190, the first memory channel structure 285 and the first division layer 302.

As the second holes 292, in which the first division layers 302 are respectively formed, define the second hole array, the first division layers 302 respectively formed in the second holes 292 may define a first division layer array.

The first division layer array may include a plurality of first division layer rows spaced apart from each other in the third direction D3, and each of the first division layer rows may include a plurality of first division layers 302 spaced apart from each other in the second direction D2. Additionally, the first division layer array may include a plurality of first division layer columns spaced apart from each other in the second direction D2, and each of the first division layer columns may include a plurality of first division layers 302 spaced apart from each other in the fourth direction D4.

Referring back to FIGS. 1 and 2A, a first opening may be formed through the first and second insulating interlayers 190 and 310 and the first mold layer to expose the upper surface of the first substrate 100, and the first sacrificial layers 180 exposed by the first opening may be removed to form first gaps, respectively, exposing a sidewall of the first memory channel structure 285.

A second blocking layer may be formed on the sidewall of the first memory channel structure 285 exposed by the first gaps, inner walls of the first gaps, sidewalls of the first insulation layers 170 and the upper surface of the first substrate 100 exposed by the first openings and an upper surface of the second insulating interlayer 310. A first gate electrode layer may be formed on the second blocking layer to fill the first gaps and the first opening. The first gate electrode layer may include a first gate barrier layer and a first gate conductive layer sequentially stacked.

The first gate electrode layer may be partially removed to form a first gate electrode 330 inside each of the first gaps.

The first gate electrode 330 may include a first gate conductive pattern and a first gate barrier pattern covering upper and lower surfaces and a portion of a sidewall of the first gate conductive pattern. In example embodiments, the first gate electrode layer may be partially removed by a wet etching process.

In example embodiments, the first gate electrode 330 may extend in the fourth direction D4, and a plurality of first gate electrodes 330 may be stacked in a plurality of levels, respectively, spaced apart from each other in the first direction D1 to form a first gate electrode structure. In example embodiments, a plurality of first gate electrode structures may be spaced apart from each other in the second direction D2 by the first memory channel structure column, which may include ones of the first memory channel structures 285 disposed in the fourth direction D4, and the first division layer column, which may include ones of the first division layers 302 disposed in the fourth direction D4.

When the first gate electrode layer is partially removed, a portion of the second blocking layer disposed on the upper surface of the second insulating interlayer 310 may also be removed, and a remaining portion of the second blocking layer may form a second blocking pattern 320.

A second division layer may be formed in the first opening.

However, referring to FIG. 2B, in an example embodiment, the first sacrificial layer 180 is not replaced with the first gate electrode 330 and the second blocking pattern 320. In this case, the first sacrificial layer 180 may include a conductive material, e.g., polysilicon doped with impurities instead of an insulating material, e.g., silicon nitride.

After forming a third insulating interlayer 340 on the second insulating interlayer 310, the second division layer and the second blocking pattern 320, a first contact plug 350 may be formed through the second and third insulating interlayers 310 and 340 to contact an upper surface of the first capping pattern 275.

A fourth insulating interlayer 360 may be formed on the third insulating interlayer 340 and the first contact plug 350, and a bit line 370 may be further formed through the fourth insulating interlayer 360 to contact an upper surface of the first contact plug 350. In example embodiments, the bit line 370 may extend in the second direction D2, and a plurality of bit lines 370 may be spaced apart from each other in the third direction D3.

Upper contact plugs contacting upper surfaces of the first gate electrodes 330 and upper wirings that apply electrical signals to the upper contact plugs may additionally be formed to complete the fabrication of the vertical memory device.

As described above, the second holes 292 may be formed to extend through respective portions of the first mold layer between neighboring ones of the first memory channel structures 285, and the first division layers 302 may be formed in the second holes 292, respectively. Thus, the first gate electrode 330, which may be formed by replacing the first sacrificial layer 180 included in the first mold layer, may extend in the fourth direction D4, and may be divided in the second direction D2 by the first memory channel structures 285 and the first division layers 302.

Figure 9:
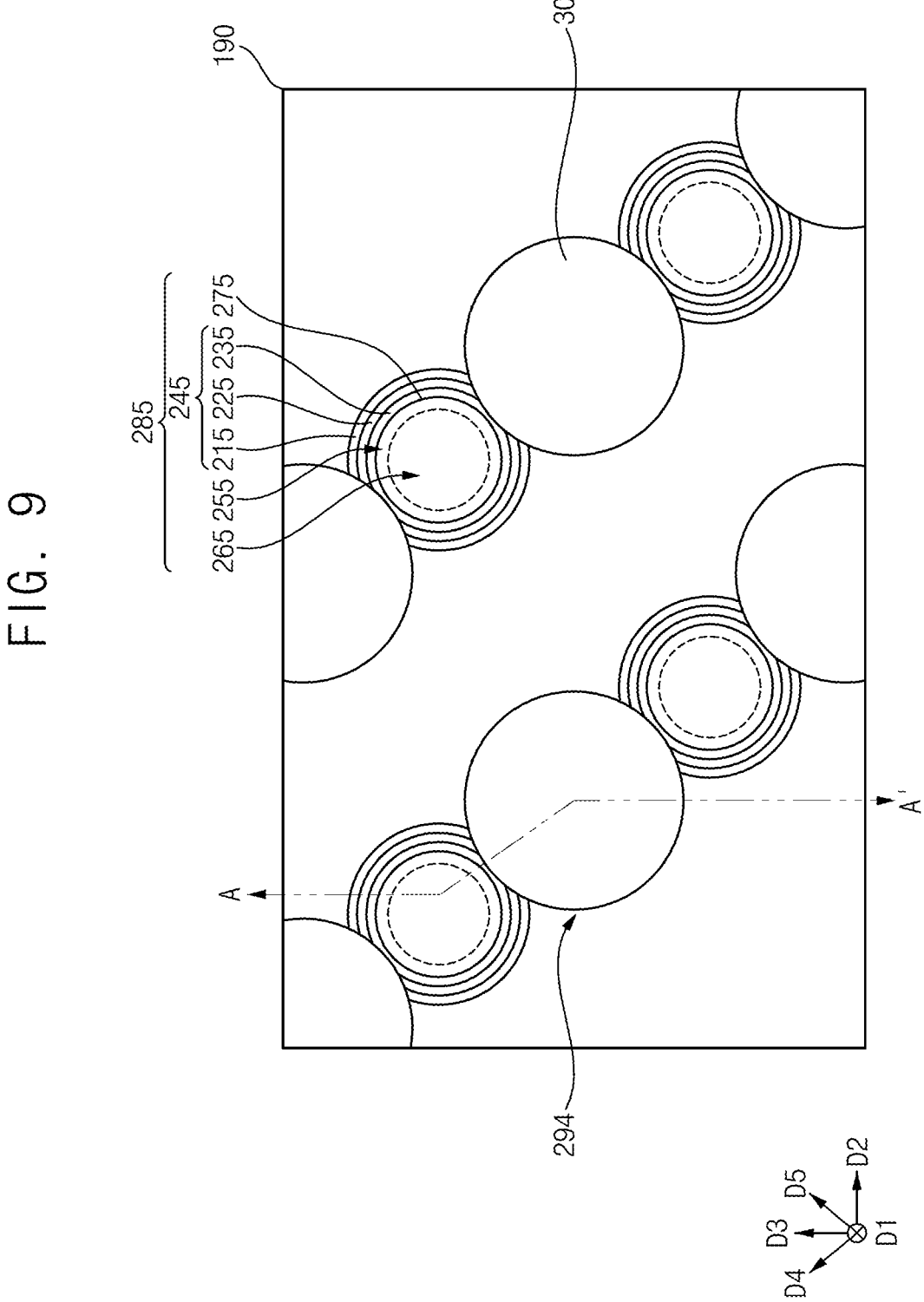
FIGS. 9 and 10 are a plan view and a cross-sectional view illustrating a vertical memory device in accordance with example embodiments, respectively.
Figure 10:
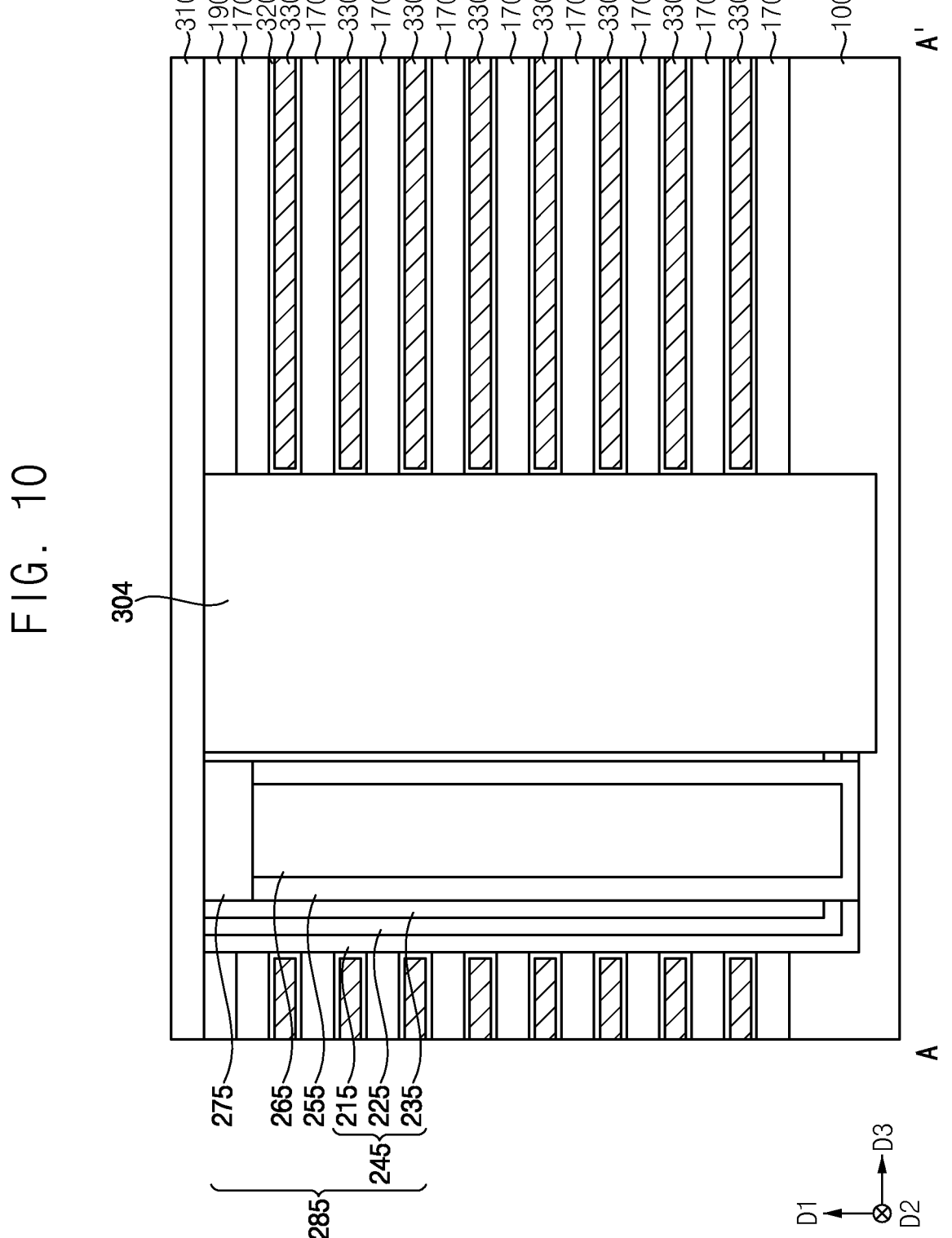

FIGS. 9 and 10 are a plan view and a cross-sectional view illustrating a vertical memory device in accordance with example embodiments, which may correspond to FIGS. 6 and 8, respectively. The vertical memory device of FIGS. 9 and 10 may be substantially the same as or similar to that of FIGS. 1 and 2A, except that the vertical memory device of FIGS. 9 and 10 may include a third hole 294 and a third division layer 304 instead of the second hole 292 and the first division layer 302, respectively. For convenience of explanation, a further description of components and technical aspects previously described may be omitted.

Referring to FIGS. 9 and 10, the third hole 294 may extend through the first charge storage structure 245 included in each of the first memory channel structures 285 disposed adjacent to each other in the fourth direction D4, for example, the first blocking pattern 215 and the first charge storage pattern 225, and may also extend through an outer lateral portion of the first tunnel insulation pattern 235. Thus, the third division layer 304 in the third hole 294 may contact an outer sidewall of the first tunnel insulation pattern 235.

Accordingly, a single first memory channel structure 285 included in the vertical memory device may include two first charge storage patterns 225 separated from each other in the fifth direction D5.

As a result, the vertical memory device may include not only two first gate electrodes 330 respectively formed at opposite sides of the single first memory channel structure 285 in the fifth direction D5, but also two first charge storage patterns 225 separated from each other in the fifth direction D5, so as to have an MLC structure.

Figure 11:
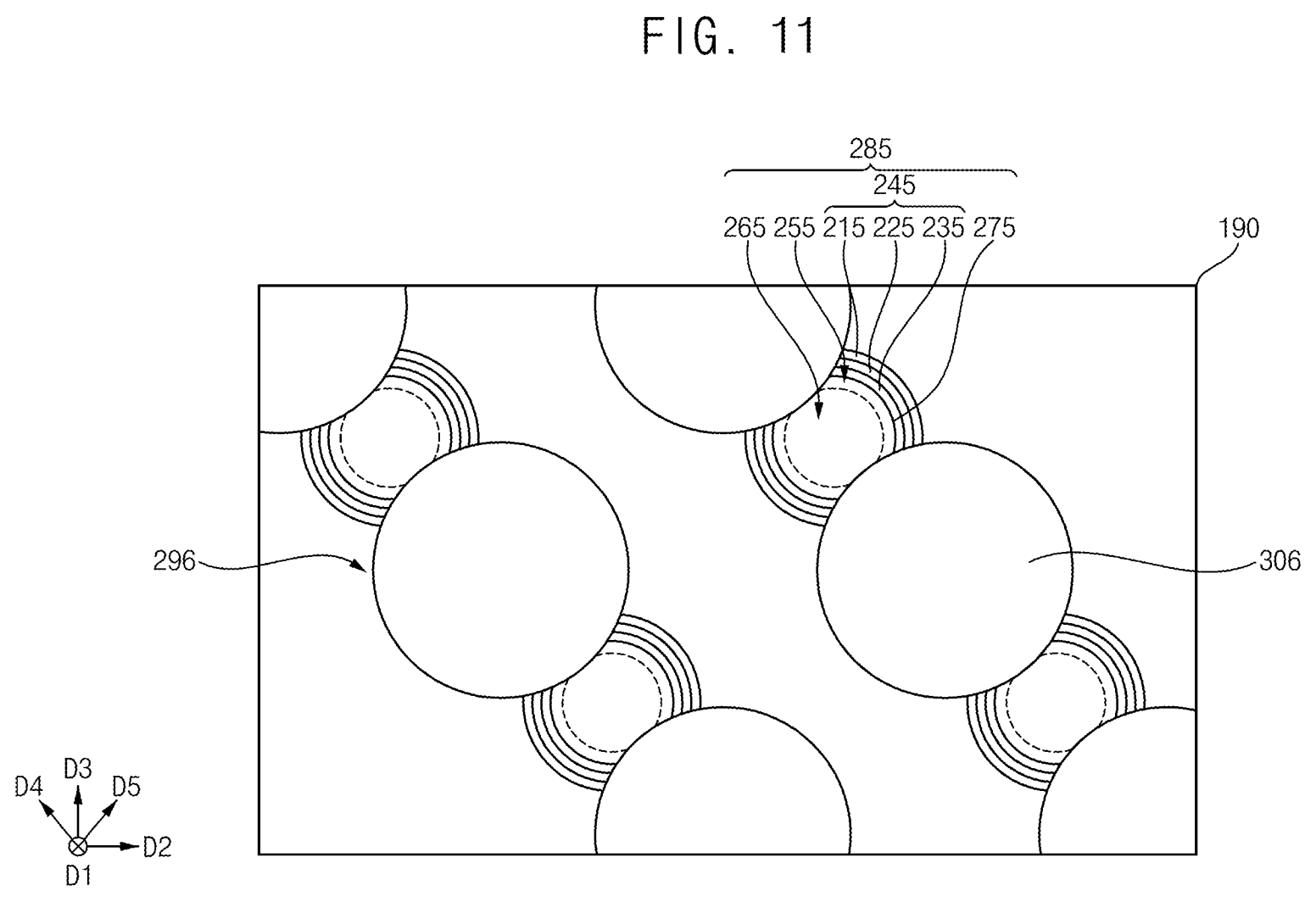
Figure 12:
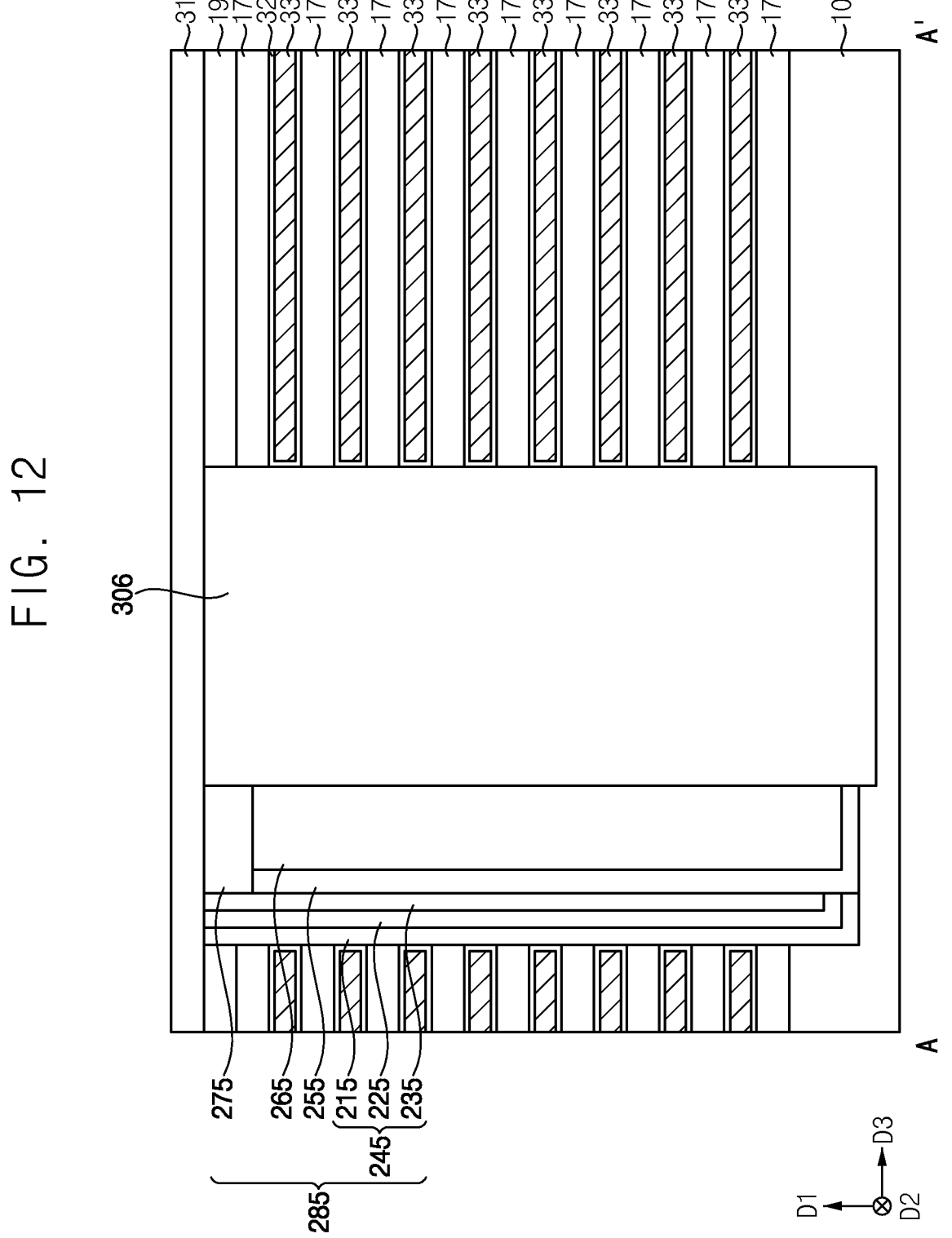

FIGS. 11 and 12 are a plan view and a cross-sectional view illustrating a vertical memory device in accordance with example embodiments, which may correspond to FIGS. 6 and 8, respectively. The vertical memory device of FIGS. 11 and 12 may be substantially the same as or similar to that of FIGS. 1 and 2A, except that the vertical memory device of FIGS. 11 and 12 may include a fourth hole 296 and a fourth division layer 306 instead of the second hole 292 and the first division layer 302, respectively. For convenience of explanation, a further description of components and technical aspects previously described may be omitted.

Referring to FIGS. 11 and 12, the fourth hole 296 may extend through the first charge storage structure 245 and the first channel included in each of the first memory channel structures 285 disposed adjacent to each other in the fourth direction D4, and the fourth division layer 306 in the fourth hole 296 may contact sidewalls of the first filling pattern 265 and the first capping pattern 275.

Accordingly, a single first memory channel structure 285 in the vertical memory device may include two first charge storage structures 245 separated from each other in the fifth direction D5 and two first channels 255 separated from each other in the fifth direction D5.

As a result, the vertical memory device may include not only two first gate electrodes 330 respectively formed at opposite sides of the single first memory channel structure 285 in the fifth direction D5, but also two first charge storage patterns 225 and two first channels 255 separated from each other in the fifth direction D5, so as to have an MLC structure.

Figure 13:
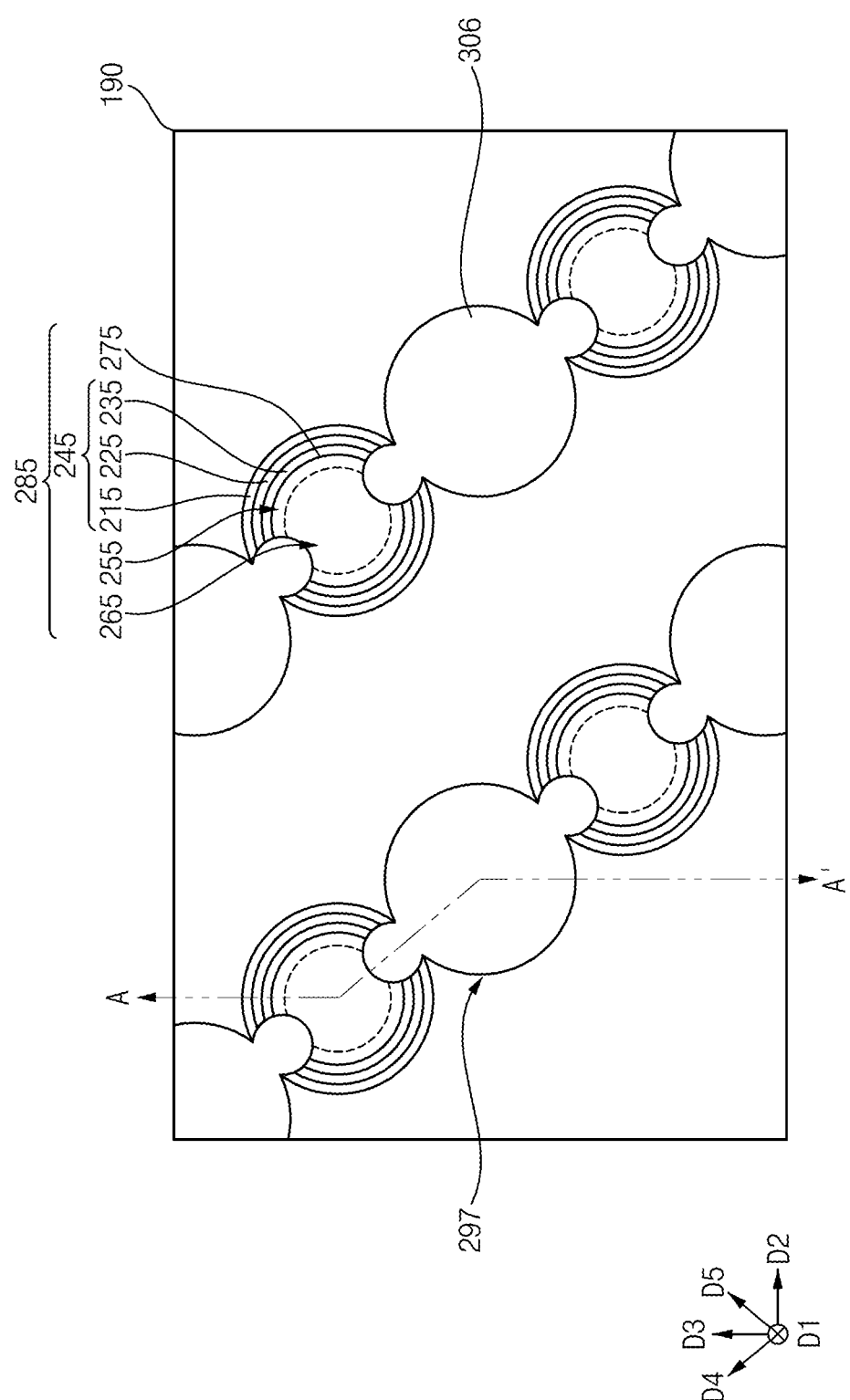
FIG. 13 is a plan view illustrating a vertical memory device in accordance with example embodiments.

FIG. 13 is a plan view illustrating a vertical memory device in accordance with example embodiments, which may correspond to FIG. 11. The vertical memory device of FIG. 13 may be substantially the same as or similar to that of FIGS. 11 and 12, except that the vertical memory device of FIG. 13 may include a fifth hole 297 instead of the fourth hole 296. For convenience of explanation, a further description of components and technical aspects previously described may be omitted.

Referring to FIG. 13, the fifth hole 297 may be formed by forming the second hole 292, and forming a hole extending through the first charge storage structure 245 and the first channel 255 by an additional etching process.

The fifth division layer that may be formed in the fifth hole 297 may contact sidewalls of the first filling pattern 265 and the first capping pattern 275.

In example embodiments, the second hole 292 may have a shape of a first circle having a first radius in a plan view, and the additional hole may have a shape of a portion of a second circle, which may protrude outwardly from the first circle and have a second radius smaller than the first radius in a plan view.

Accordingly, the fifth division layer that may be formed in the fifth hole 297 may have a shape of the first circle having the first radius and the portion of the second circle having the second radius smaller than the first radius and protruding outwardly from the first circle in a plan view, which may correspond to the shape of the fifth hole 297.

As a result, a single first memory channel structure 285 in the vertical memory device may include two first charge storage structures 245 separated from each other in the fifth direction D5 and two first channels 255 separated from each other in the fifth direction D5.

Figure 14A:
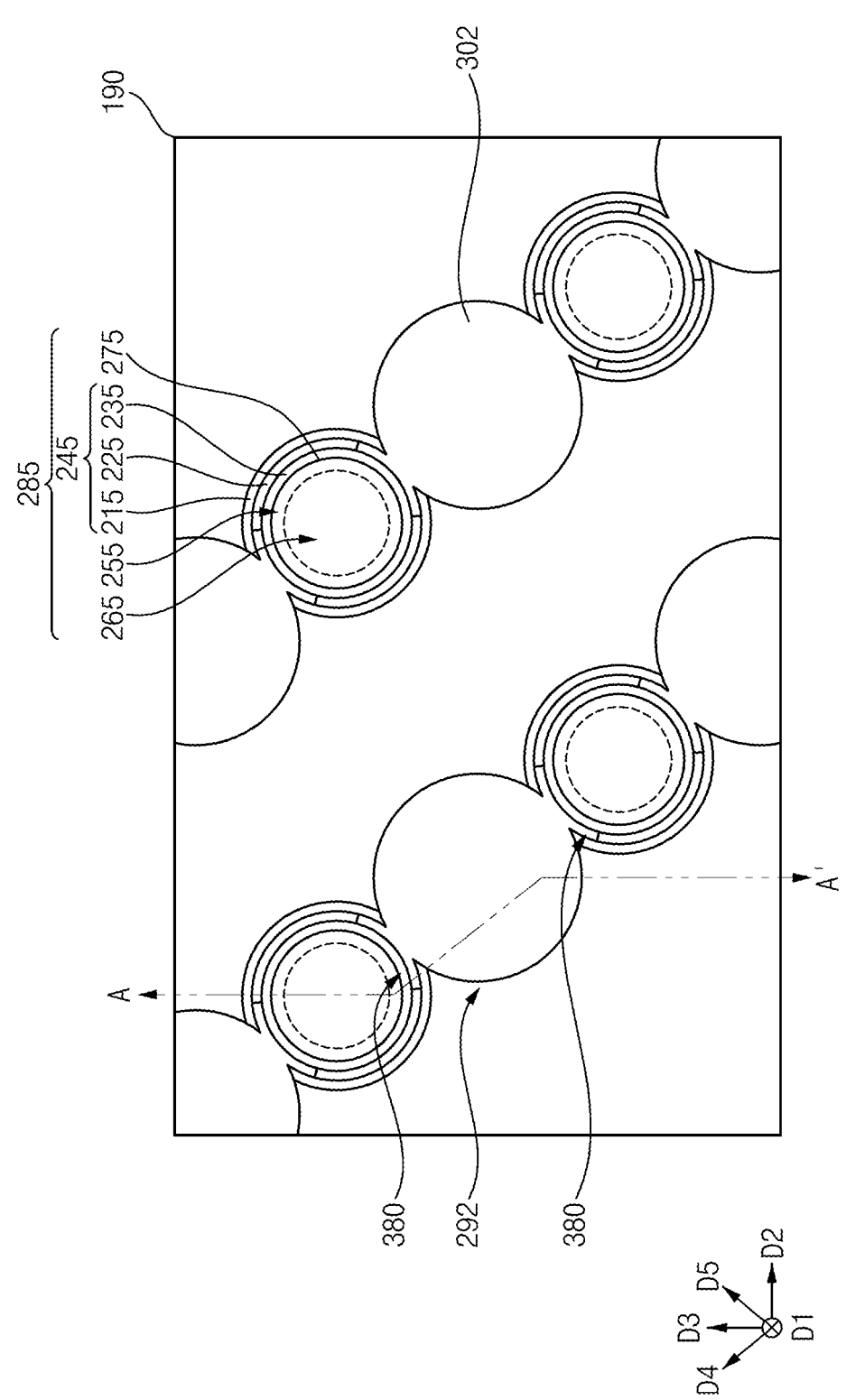
Figure 14B:
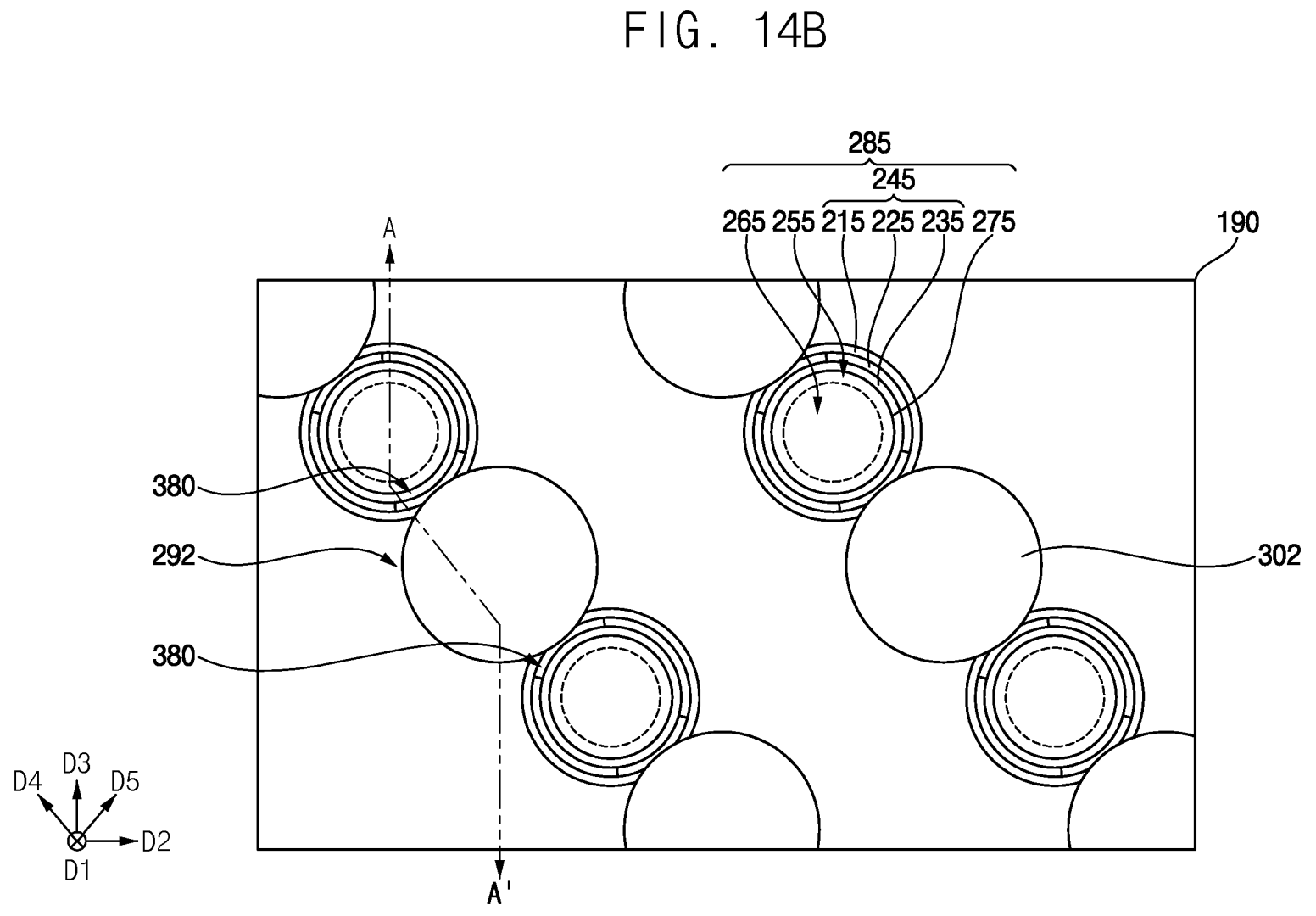
Figure 15:
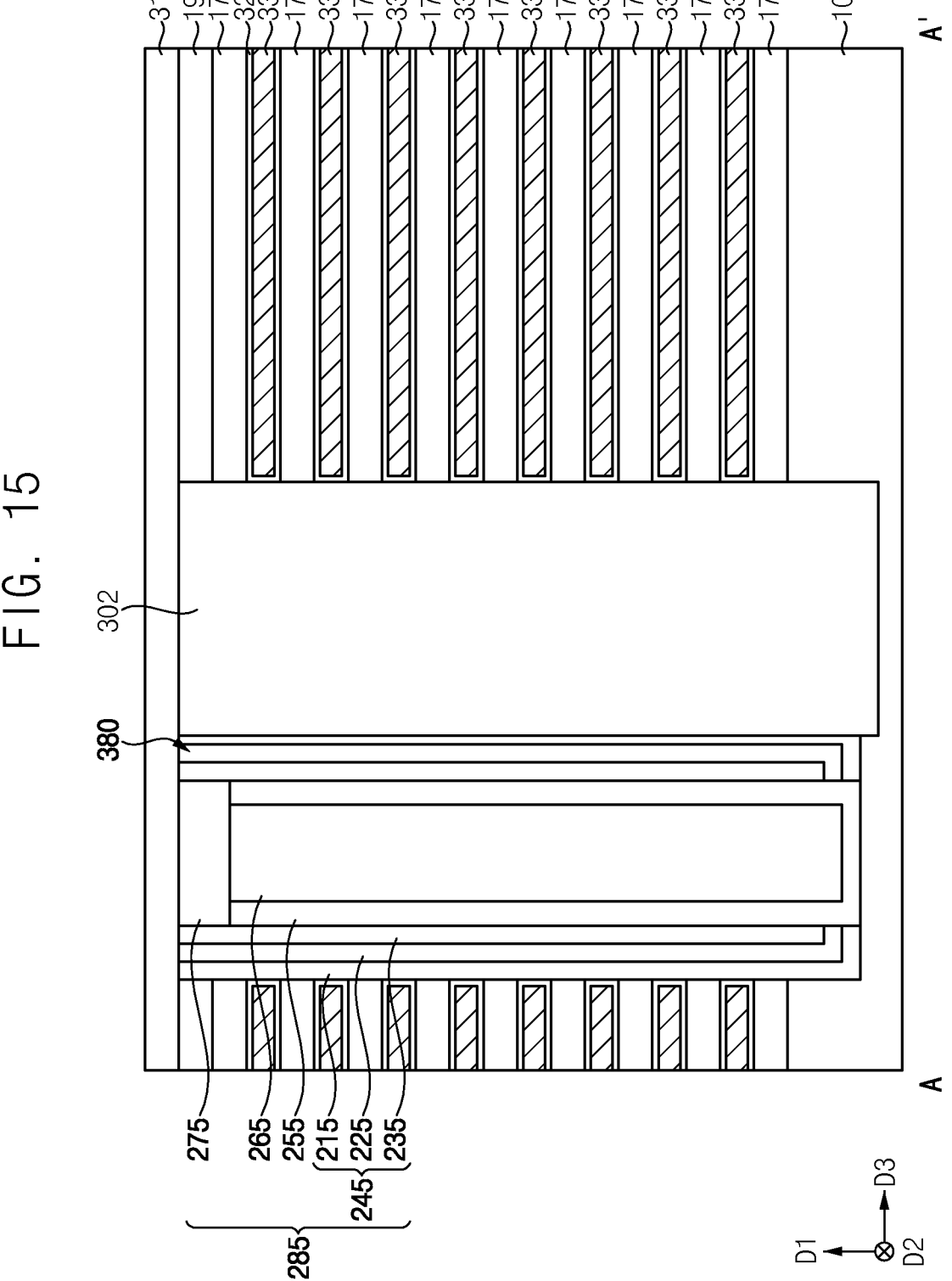

FIGS. 14A, 14B, and 15 are plan views and a cross-sectional view illustrating a vertical memory device in accordance with example embodiments. FIGS. 14A and 15 may correspond to FIGS. 6 and 8, respectively, and FIG. 14B may correspond to FIG. 15.

The vertical memory device of FIGS. 14A, 14B and 15 may be substantially the same as or similar to that of FIGS. 1 and 2A, except that the vertical memory device of FIGS. 14A, 14B and 15 may further include a first air gap 380. For convenience of explanation, a further description of components and technical aspects previously described may be omitted.

Referring to FIGS. 14A, 14B and 15, the second hole 292 may extend through the first blocking pattern 215 in each of the first memory channel structures 285 disposed adjacent to each other in the fourth direction D4 to expose a sidewall of the first charge storage pattern 225, and the exposed first charge storage pattern 225 may be partially removed to form the first air gap 380.

In example embodiments, the exposed first charge storage pattern 225 may be partially removed by a wet etching process, and the first air gap 380 may extend in the first direction D1.

Thus, a single first memory channel structure 285 in the vertical memory device may include two first blocking patterns 215 separated from each other in the fifth direction D5, and a portion of the first charge storage pattern 225 disposed adjacent to the first division layer 302 may be the first air gap 380 containing air, instead of a nitride, e.g., silicon nitride.

As the first air gap 380 may be formed, the first charge storage pattern 225 may have increased trap sites.

The second hole 292 may be filled with the first division layer 302.

FIGS. 16 to 21 are plan views and cross-sectional views illustrating a vertical memory device in accordance with example embodiments.

Figure 16:
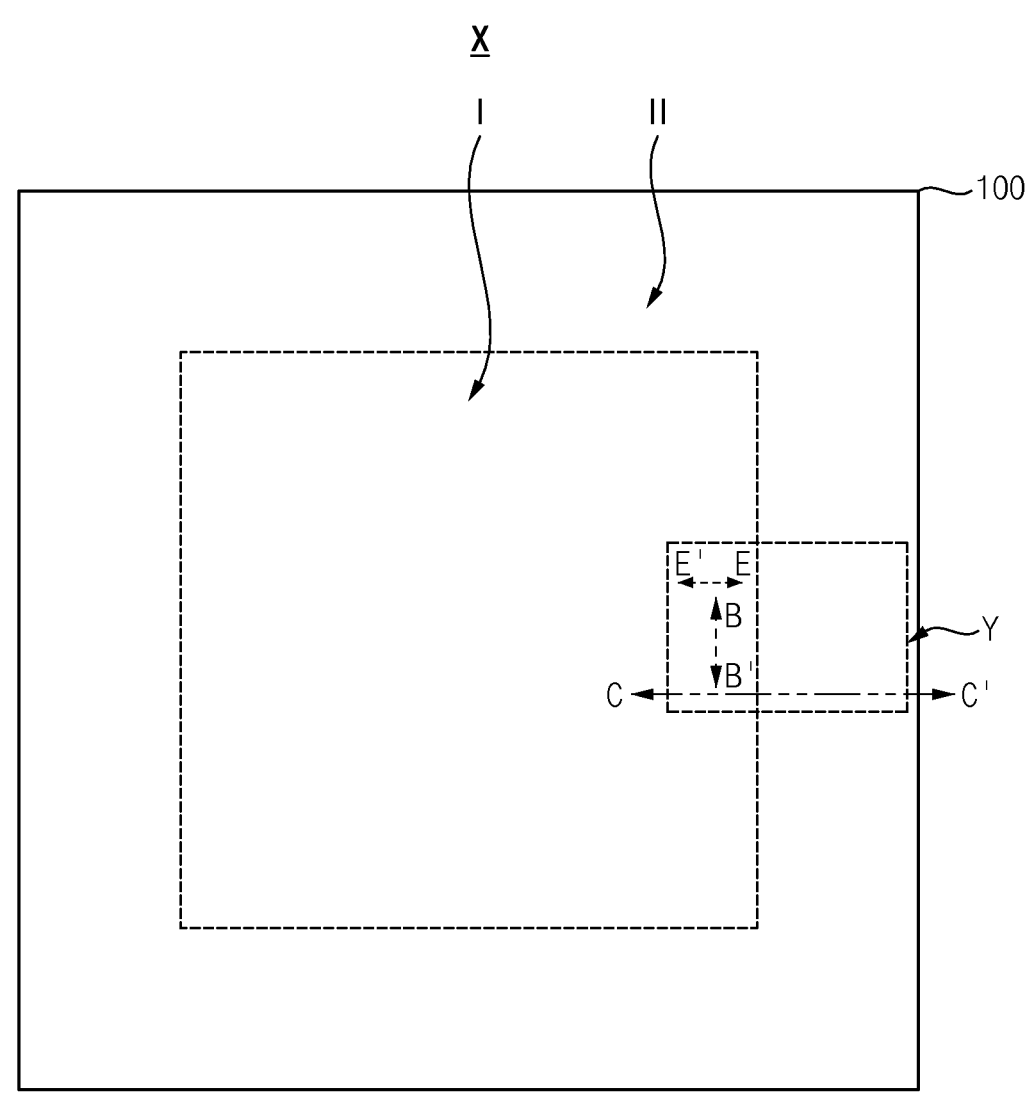
FIGS. 16 to 21 are plan views and cross-sectional views illustrating a vertical memory device in accordance with example embodiments.
Figure 16:
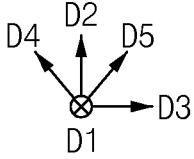
Figure 17:
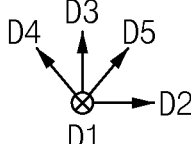
Figure 18:
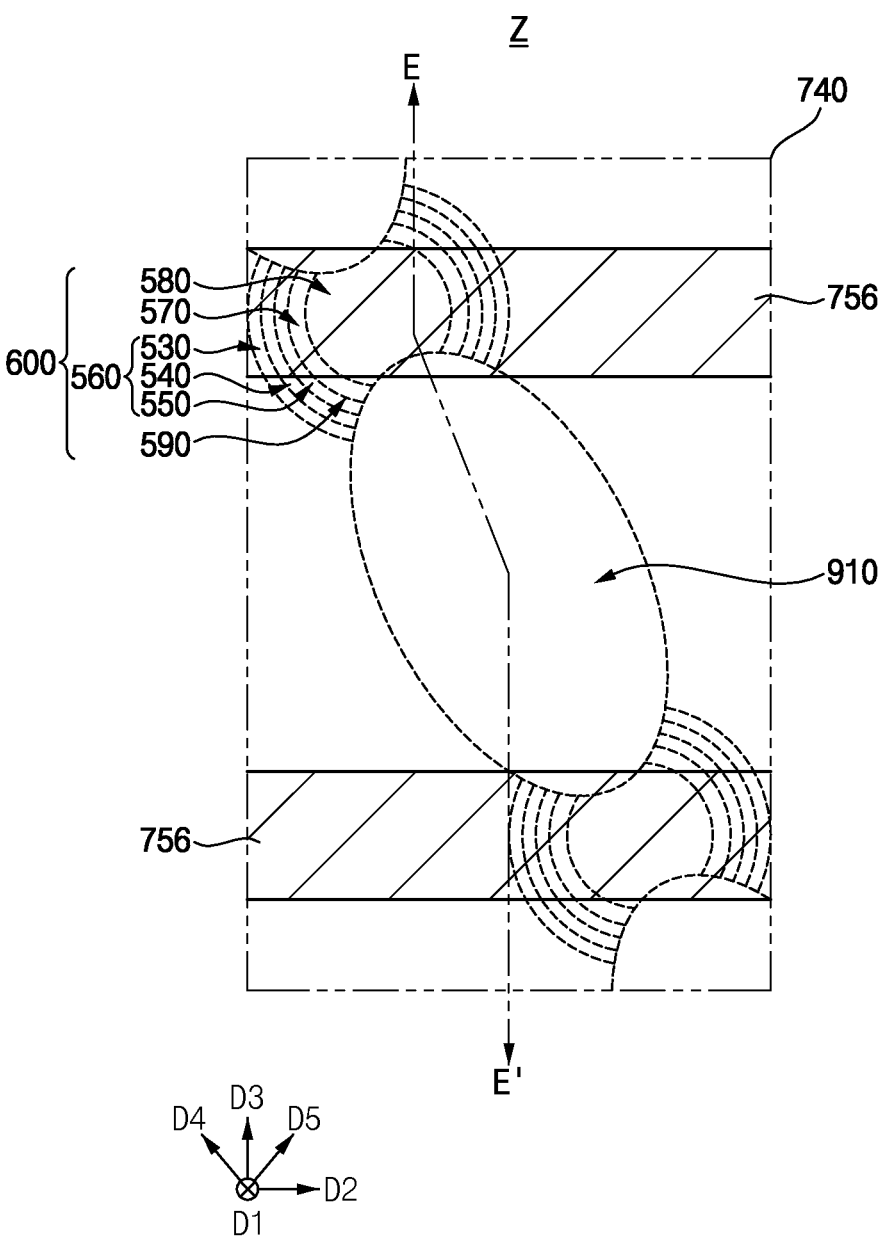
Figure 19:
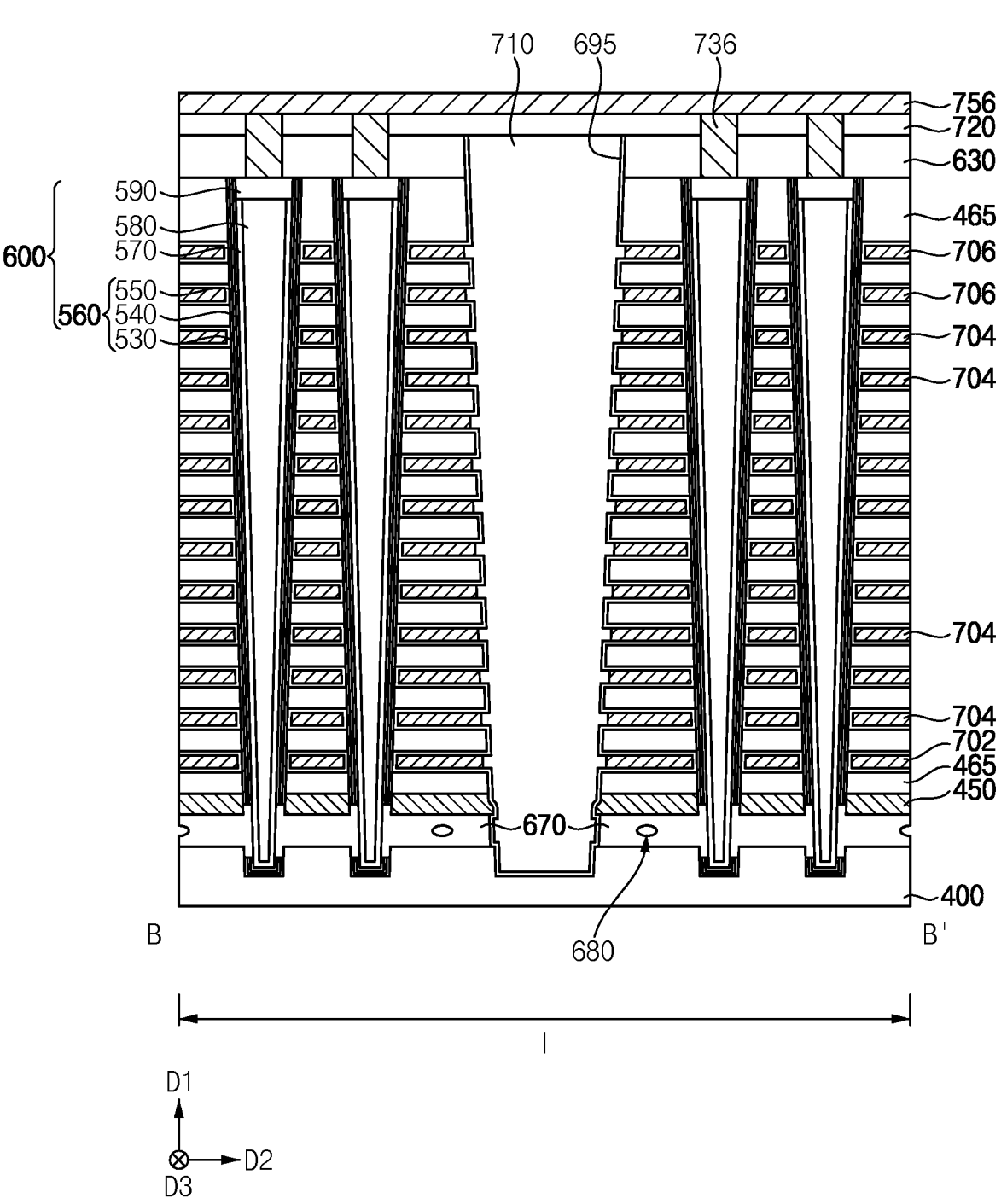
Figure 20:
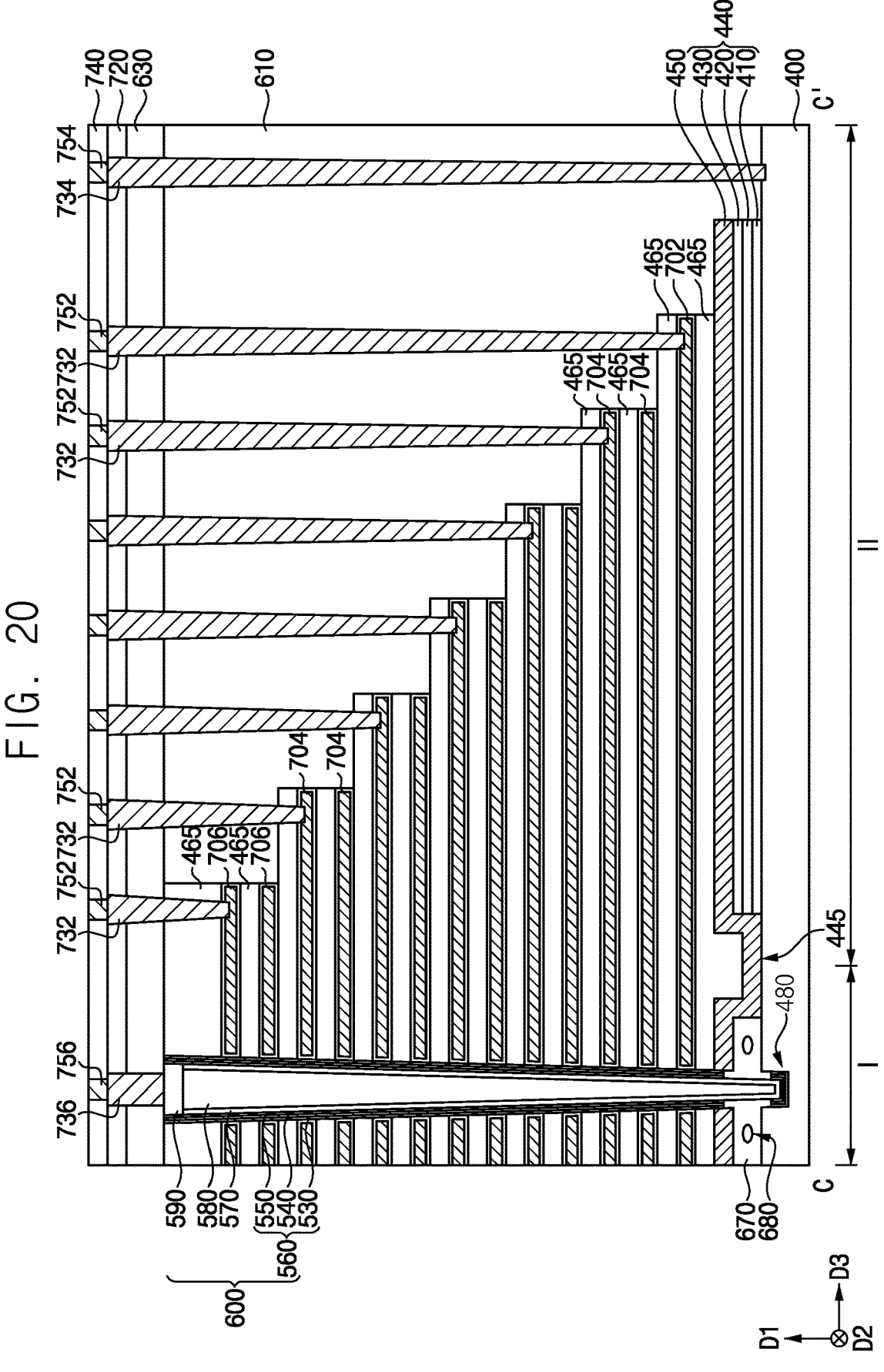
Figure 21:
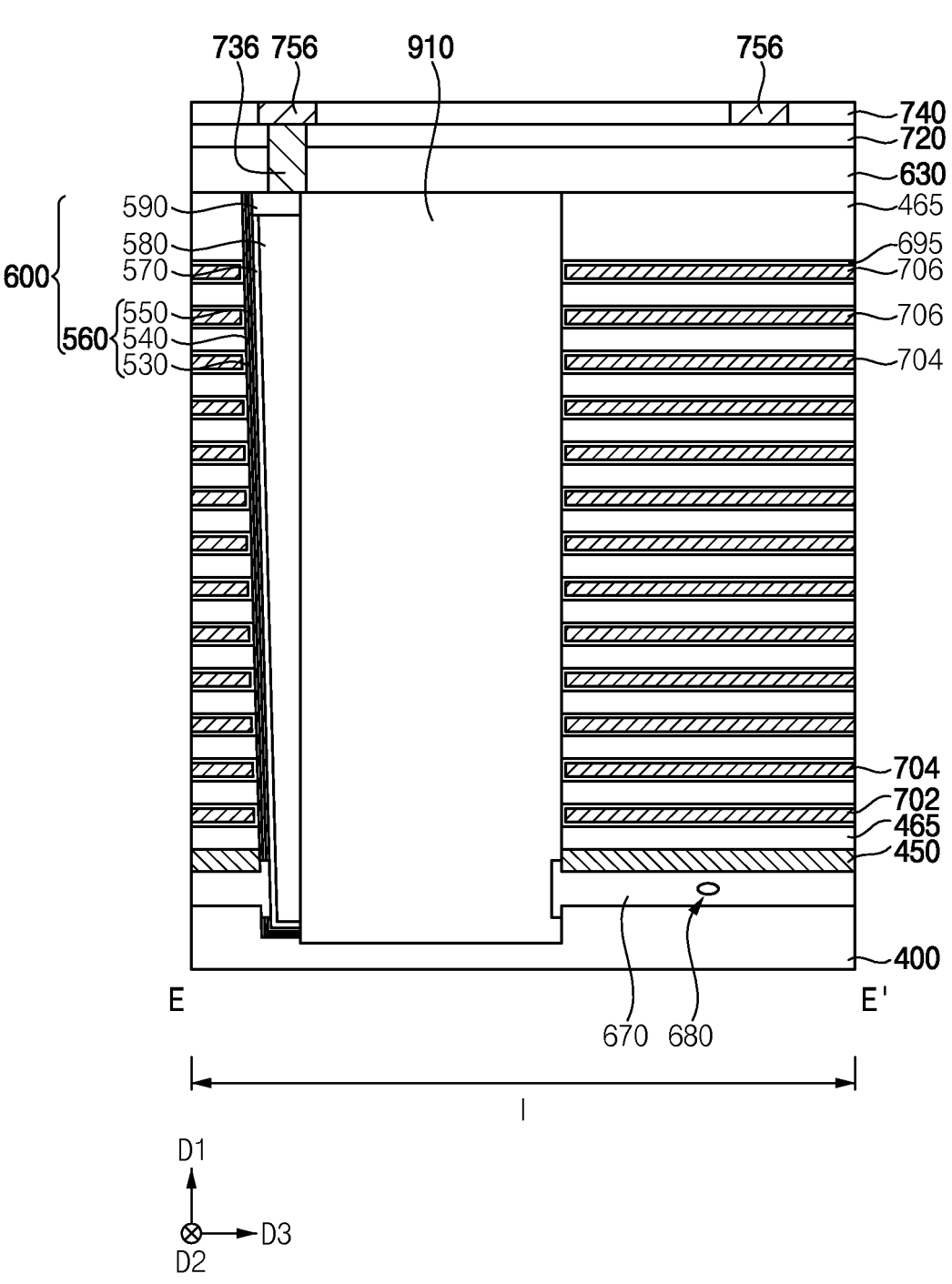

For example, FIGS. 16 to 18 are plan views, FIG. 19 is a cross-sectional view taken along line B-B' of FIG. 17, FIG. 20 is a cross-sectional view taken along line C-C' of FIG. 17, and FIG. 21 is a cross-sectional view taken along line E-E' of FIG. 17. FIG. 18 is an enlarged plan view of region Z of FIG. 17, and FIGS. 17 to 21 correspond to region Y of FIG. 16.

The vertical memory device of FIGS. 16 to 21 may be substantially the same as or similar to that of FIGS. 11 and 12 except for some components. For convenience of explanation, a further description of components and technical aspects previously described may be omitted.

Referring to FIGS. 16 to 21, the vertical memory device may include a second gate electrode structure, a second memory channel structure 600 and sixth to eighth division layers 910, 620 and 710 disposed on a second substrate 400.

The vertical memory device may further include a support layer 450, a sacrificial layer structure 440, a channel connection pattern 670, a fourth blocking pattern 695, a second insulation pattern 465, second to fourth contact plugs 732, 734 and 736, first to third wirings 752, 754 and 756, and fifth to eighth insulating interlayers 610, 630, 720 and 740.

The second substrate 400 may include a first region I and a second region II surrounding the first region I.

In example embodiments, the first region I of the second substrate 400 may be a cell array region, and the second region II of the second substrate 400 may be a pad region or an extension region. The first and second regions I and II of the second substrate 400 may collectively form a cell region. That is, memory cells may be disposed in the first region I of the second substrate 100, and contact plugs that transfer signals to the memory cells and pads of gate electrodes contacting the contact plugs may be disposed in the second region II of the second substrate 400. Although it is illustrated that the second region II may completely surround the first region I, embodiments of the inventive concept are not limited thereto. For example, according to example embodiments, the second region II may be disposed only at opposite sides of the first region I in the second direction D2.

A third region surrounding the second region II of the second substrate 400 may be further disposed, and a circuit pattern that transfers electrical signals to the memory cells through the contact plugs may be disposed in the third region of the second substrate 400.

The sacrificial layer structure 440, the channel connection pattern 670 and the support layer 450 may be disposed on the second substrate 400.

The channel connection pattern 670 may be disposed in the first region I of the second substrate 400, and the sacrificial layer structure 440 may be disposed in the second region II of the second substrate 400. In some embodiments, the channel connection pattern 670 may include a second air gap 680 disposed therein.

The support layer 450 may be disposed on the channel connection pattern 670 and the sacrificial layer structure 440, and may also be disposed in the second opening 445 extending through the channel connection pattern 670 and the sacrificial layer structure 440 to expose an upper surface of the second substrate 400. A portion of the support layer 450 in the second opening 445 may be referred to as a support pattern.

The support pattern may be disposed in various layouts in a plan view. For example, a plurality of support patterns may be spaced apart from each other in the second and third directions D2 and D3 in the first region I of the second substrate 400, and the support pattern may extend in the second direction D2 or the third direction D3 on a boundary between the first and second regions I and II of the second substrate 400. Additionally, a plurality of support patterns, each of which may extend in the third direction D3, may be spaced apart from each other in the second direction D2 in the second region II of the second substrate 400. FIG. 20 shows one of the support patterns extending in the second direction D2 on the boundary between the first and second regions I and II of the second substrate 400.

The channel connection pattern 670 may include, for example, polysilicon doped with n-type impurities or undoped polysilicon.

The sacrificial layer structure 440 may include second to fourth sacrificial layers 410, 420 and 430 sequentially stacked in the first direction D1. The second and fourth sacrificial layers 410 and 430 may each include an oxide, e.g., silicon oxide, and the third sacrificial layer 420 may include a nitride, e.g., silicon nitride. The support layer 450 and the support pattern may include a material having an etching selectivity with respect to the second to fourth sacrificial layers 410, 420 and 430, for example, polysilicon doped with n-type impurities.

The second gate electrode structure may include second gate electrodes, each of which may extend in the third direction D3, respectively disposed at a plurality of levels spaced apart from each other in the first direction D1 on the support layer 450 and the support pattern. The second insulation pattern 465 may be disposed between the second gate electrodes and between the second gate electrode and the support layer 450 and the support pattern. The second insulation pattern 465 may include an oxide, e.g., silicon oxide.

In example embodiments, the second gate electrode structure may include third to fifth gate electrodes 702, 704 and 706 sequentially stacked in the first direction D1. In some embodiments, a sixth gate electrode, which may perform a body erase operation using a gate induced drain leakage (GIDL) phenomenon, may be additionally disposed below the third gate electrode 702 or above the fifth gate electrode 706.

In example embodiments, the third gate electrode 702 may serve as a ground selection line (GSL) and the fifth gate electrode 706 may serve as a string selection line (SSL). FIGS. 19 to 21 show that the third gate electrode 702 is disposed at a lowermost level and the fifth gate electrodes 706 are disposed at an uppermost level and a level directly below the uppermost level, respectively. However, embodiments of the inventive concept are not limited thereto, and each of the third and fifth gate electrodes 702 and 706 may be disposed at a single level or a plurality of levels according to example embodiments. The fourth gate electrodes 704 may be disposed at a plurality of levels, respectively, between the third and fifth gate electrodes 702 and 706, and serve as word lines.

In example embodiments, the second gate electrode structure may have a staircase shape in which a length in the third direction D3 decreases in a stepwise manner in the first direction D1 from a lowermost level toward an uppermost level, and thus, the second gate electrode structure may include steps arranged in the third direction D3 in the second region II of the substrate 400. In some embodiments, the second gate electrode structure may further include steps arranged in the second direction D2 in the second region II of the second substrate 400.

Hereinafter, a portion of each of the gate electrodes corresponding to the step of the second gate electrode structure, that is, an end portion of each of the second gate electrodes that is not overlapped by upper ones of the second gate electrodes, may be referred to as a pad. Thus, the pads of the second gate electrodes may be disposed in the second region II of the substrate 400.

Each of the third to fifth gate electrodes 702, 704 and 706 may include a second gate conductive pattern and a second gate barrier pattern covering a surface of the second gate conductive pattern. The second gate conductive pattern may include a metal having a low electrical resistance, e.g., tungsten, titanium, tantalum, platinum, etc., and the second gate barrier pattern may include a metal nitride, e.g., titanium nitride, tantalum nitride, etc.

In example embodiments, a plurality of second gate electrode structures may be spaced apart from each other in the second direction D2. The eighth division layer 710 extending in the third direction D3 may be disposed between ones of the second gate electrode structures disposed adjacent to each other in the second direction D2 in the first and second regions I and II of the second substrate 400.

The eighth division layer 710 may include an oxide, e.g., silicon oxide.

In example embodiments, a plurality of memory blocks, each of which may include the second gate electrode structure in an area defined by ones of the eighth division layers 710 disposed adjacent to each other in the second direction D2 and a plurality of the second memory channel structures in the area, may be spaced apart from each other in the second direction D2 to form a memory block array.

The second memory channel structure 600 may include a second charge storage structure 560, a second channel 570, a second filling pattern 580 and a second capping pattern 590 disposed on the second substrate 400. In example embodiments, a plurality of second memory channel structures 600 may be spaced apart from each other in the second and third directions D2 and D3 in the first region I of the second substrate 400 to define a second memory channel structure array.

The second memory channel structure array may include a plurality of second memory channel structure rows spaced apart from each other in the third direction D3, and each of the second memory channel structure rows may include a plurality of second memory channel structures 600 spaced apart from each other in the second direction D2. In addition, the second memory channel structure array may include a plurality of first memory channel structure columns spaced apart from each other in the second direction D2, and each of the first memory channel structure columns may include a plurality of second memory channel structures 600 spaced apart from each other in the fourth direction D4.

In an example embodiment, each of the second memory channel structures 600 may have a width that may gradually decrease from an upper portion toward a lower portion thereof.

The sixth division layer 910 may be disposed between ones of the second memory channel structures 600 neighboring in the fourth direction D4 in each of the second memory channel structure columns in the first region I of the second substrate 400, and may extend through the second charge storage structure 560 and the second channel 570 in each of the second memory channel structures 600. The sixth division layer 910 may contact sidewalls of the second filling pattern 580 and the second capping pattern 590.

In example embodiments, a plurality of sixth division layers 910 may be spaced apart from each other in the second and third directions D2 and D3 to define a sixth division layer array.

The sixth division layer array may include a plurality of sixth division layer rows spaced apart from each other in the third direction D3, and each of the sixth division layer rows may include a plurality of sixth division layers 910 spaced apart from each other in the second direction D2. Additionally, the sixth division layer array may include a plurality of sixth division layer columns spaced apart from each other in the second direction D2, and each of the sixth division layer columns may include a plurality of sixth division layers 910 spaced apart from each other in the fourth direction D4.

The seventh division layer 620 may extend through the fifth insulation interlayer 610, and some of the second insulation patterns 465 and the second gate electrodes.

The seventh division layer 620 may extend in the third direction D3 in the first and second regions I and II of the second substrate 400, and for example, may extend through ones of the second gate electrodes at two upper levels, respectively. Thus, each of the ones of the second gate electrodes at the two upper levels may be divided in the second direction D2 by the seventh division layer 620. In an example embodiment, the seventh division layer 620 may extend through an upper portion of some of the second memory channel structures 600.

The fourth blocking pattern 695 may cover upper and lower surfaces and a portion of a sidewall facing the second memory channel structure 600 of each of the third to fifth gate electrodes 702, 704 and 706. The fourth blocking pattern 695 may include a metal oxide, e.g., aluminum oxide or hafnium oxide.

The fifth insulation interlayer 610 may be disposed on the second substrate 400, and may cover sidewalls of the second gate electrode structure and the second insulating pattern 465. The sixth insulation interlayer 630 may be disposed on the fifth insulation interlayer 610, an uppermost one of the second insulating patterns 465 and the second memory channel structure 600. In addition, the seventh and eighth insulation interlayers 720 and 740 may be sequentially stacked on the sixth insulation interlayer 630. Each of the fifth to eighth insulation interlayers 610, 630, 720 and 740 may include an oxide, e.g., silicon oxide.

The second and third contact plugs 732 and 734 may extend through the fifth to seventh insulating interlayers 610, 630 and 720, and may contact upper surfaces of the pads of the third to fifth gate electrodes 702, 704 and 706 and the upper surface of the second substrate 400 in the second region II of the second substrate 400. The fourth contact plug 736 may extend through the sixth and seventh insulation interlayers 630 and 720, and may contact an upper surface of the second capping pattern 590 in the first region I of the substrate 400.

FIG. 17 shows exemplary layouts of the second to fourth upper contact plugs 732, 734 and 736. However, embodiments of the inventive concept are not limited thereto.

The first to third wirings 752, 754 and 756 may extend through the eighth insulation interlayer 740, and may contact upper surfaces of the second to fourth contact plugs 732, 734 and 736, respectively. The layouts of the second to fourth contact plugs 732, 734 and 736 and the first to third wirings 752, 754 and 756 shown in FIG. 17 are an example, and embodiments of the inventive concept are not limited thereto.

In example embodiments, the third wiring 756 may extend in the second direction D2 in the first region I of the second substrate 400, and a plurality of third wirings 756 may be spaced apart from each other in the third direction D3. Each of the third wirings 756 may serve as a bit line of the vertical memory device.

The second to fourth contact plugs 732, 734 and 736 and the first to third wirings 752, 754 and 756 may include a conductive material, e.g., a metal, a metal nitride, a metal silicide, etc.

As described above, the sixth division layer 910 may extend through a portion of the second charge storage structure 560 and a portion of the second channel 570 included in the second memory channel structure 600, and the second charge storage structure 560 and the second channel 570 may be divided in the fifth direction D5 by the sixth division layers 910 at opposite sides of the memory channel structure 600 in the fourth direction D4.

Thus, when compared to a vertical memory device in which, for example, a single second memory channel structure 600 includes a single second channel 570, this vertical memory device may include two second channels 570 at respective opposite sides of a single second memory channel structure 600 in the fifth direction D5, so as to have an MLC structure.

FIGS. 22 to 35 are plan views and cross-sectional views illustrating a method of manufacturing a vertical memory device in accordance with example embodiments.

Figure 22:
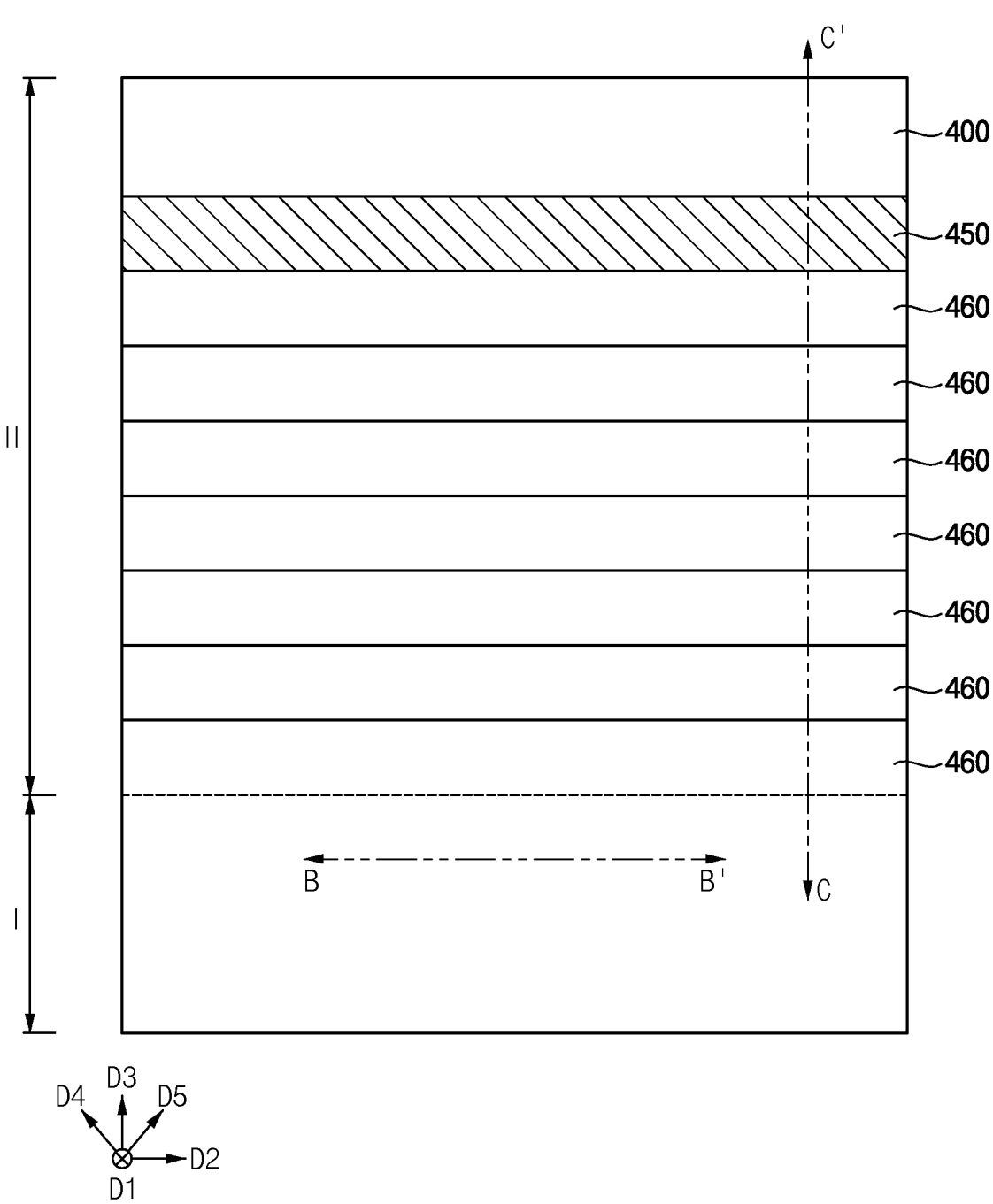
Figure 23:
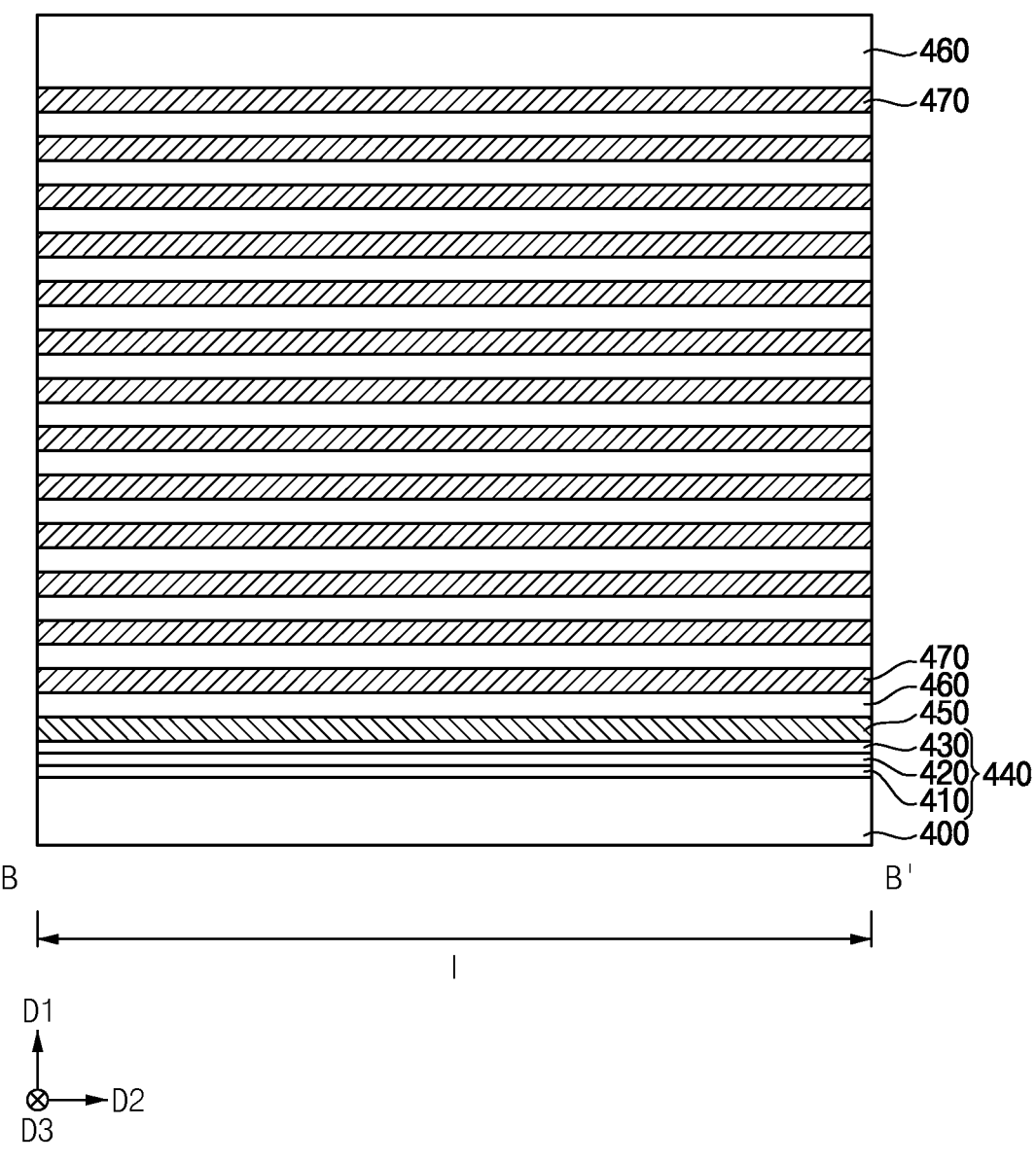
Figure 24:
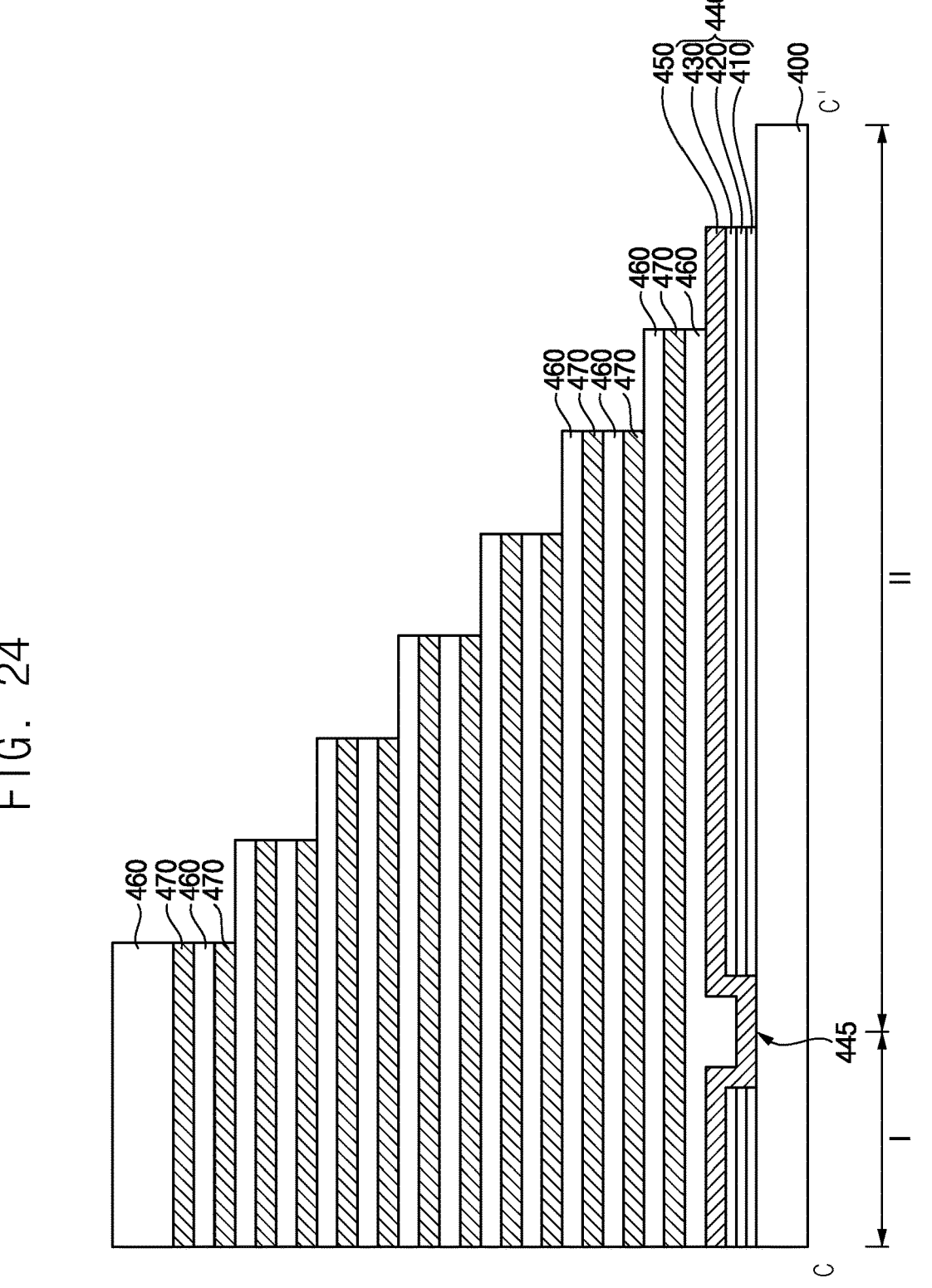
Figure 28:
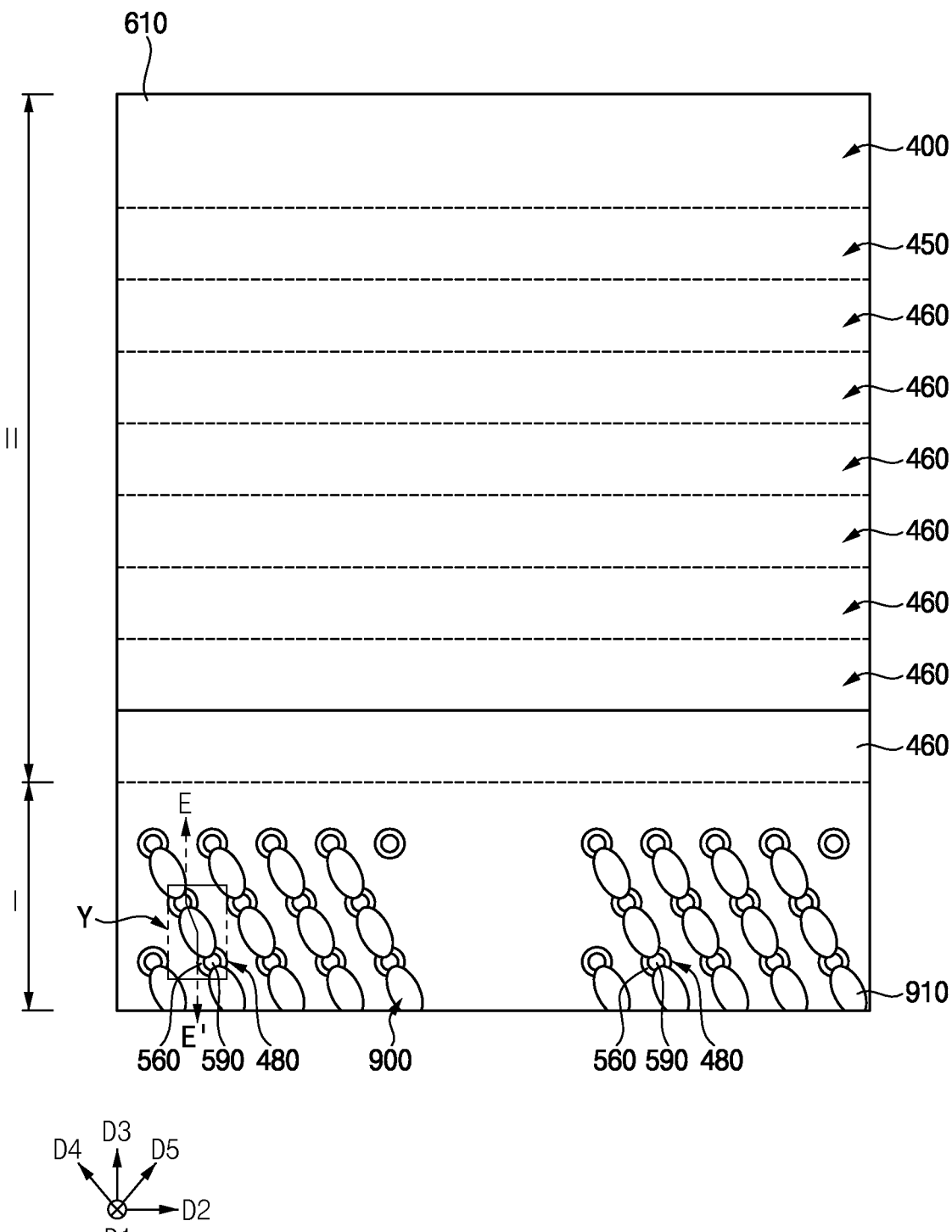
Figure 29:
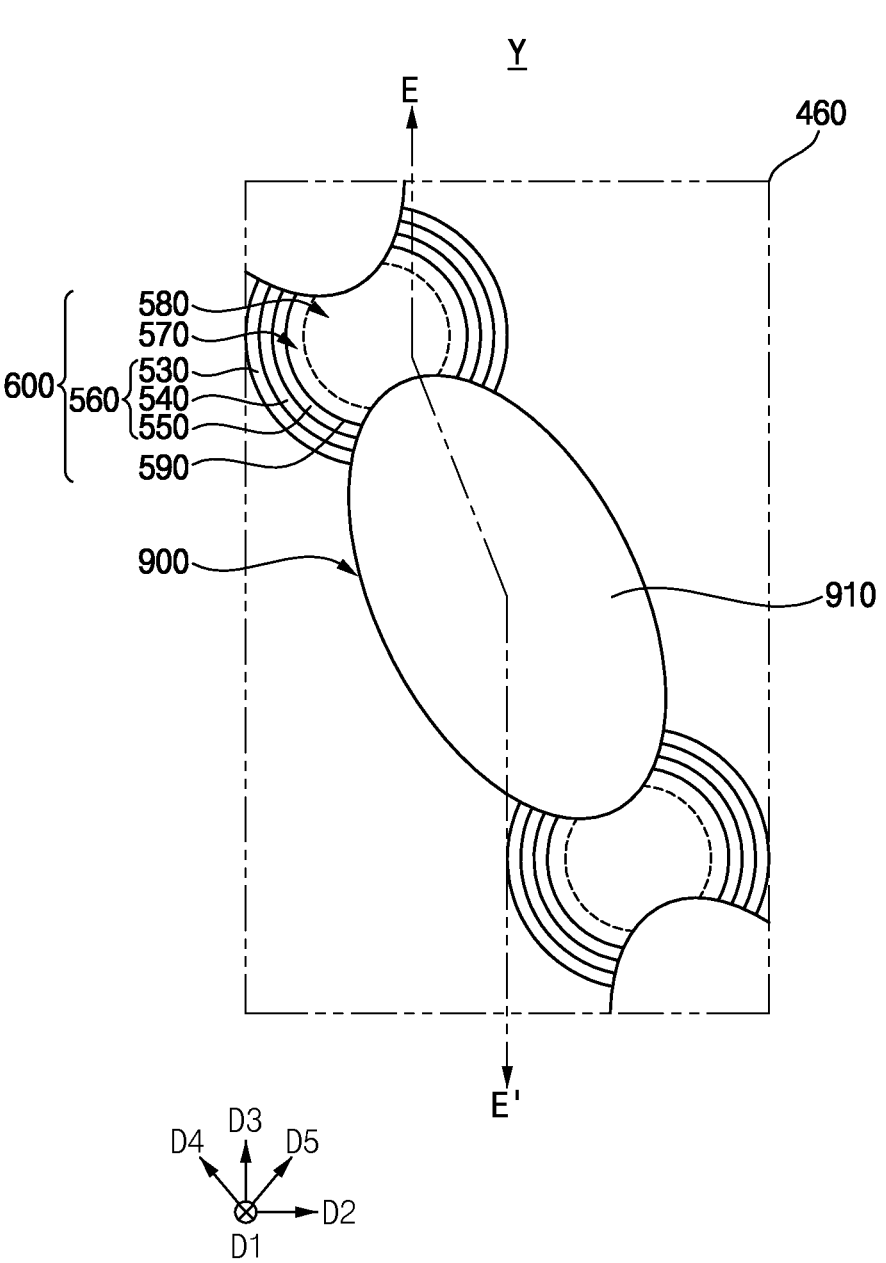
Figure 30:
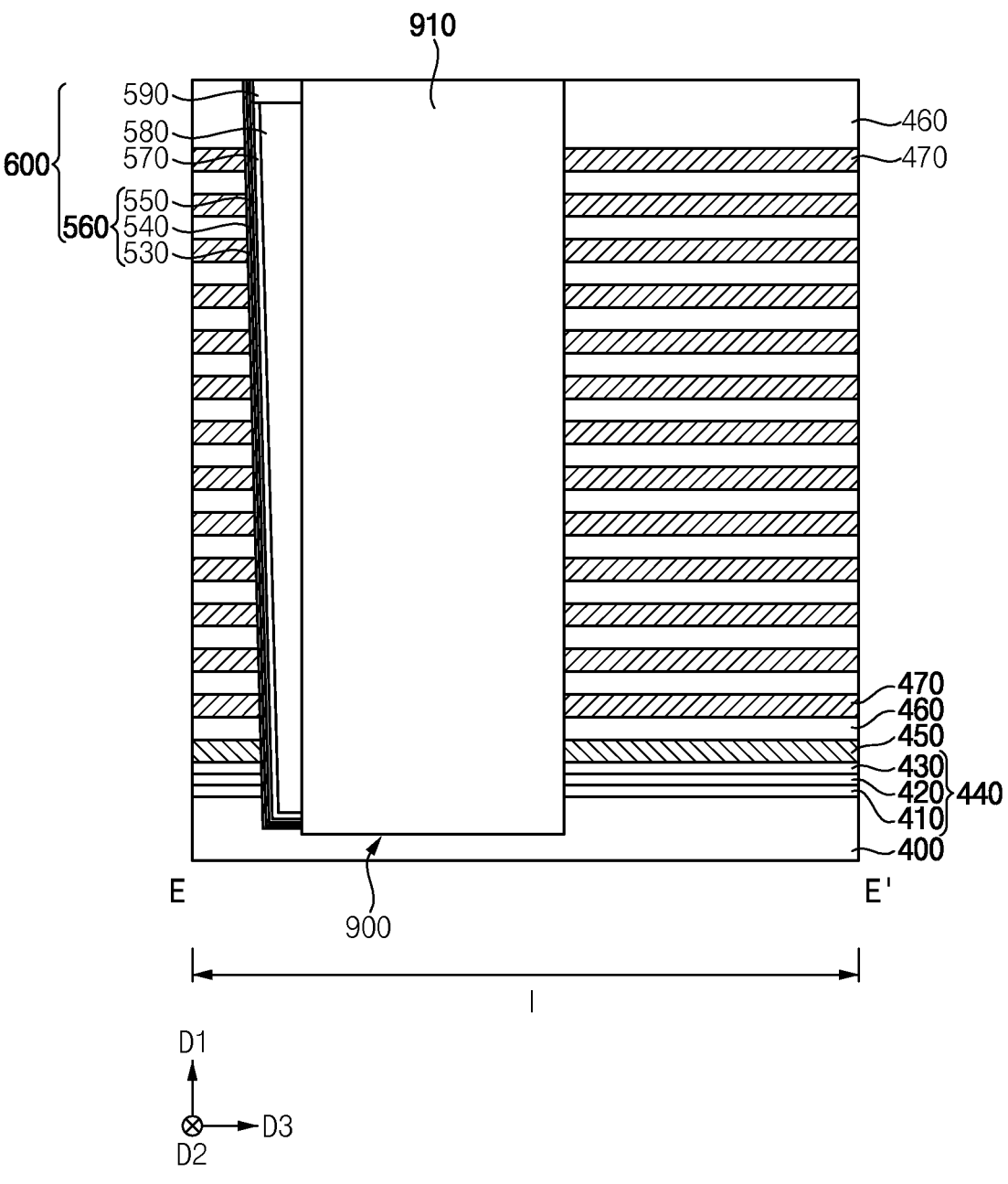

For example, FIGS. 22, 25, 28-29, and 31 are plan views, FIGS. 23, 26, and 32-35 are cross-sectional views taken along lines B-B' of corresponding plan views, respectively, and FIGS. 24 and 27 are cross-sectional views taken along lines C-C' of corresponding plan views, respectively. FIG. 30 is a cross-sectional view taken along line E-E' of a corresponding plan view. FIG. 29 is an enlarged plan view of region Y of FIG. 28.

Referring to FIGS. 22 to 24, a sacrificial layer structure 440 may be formed on a second substrate 400, a second opening 445 may be formed by partially removing the sacrificial layer structure 440 to expose an upper surface of the second substrate 400, and a support layer 450 may be formed on an upper surface of the sacrificial layer structure 440 and the exposed upper surface of the second substrate 400.

The sacrificial layer structure 440 may include second to fourth sacrificial layers 410, 420 and 430 sequentially stacked in the first direction D1. The second and fourth sacrificial layers 410 and 430 may each include, for example, an oxide such as silicon oxide, and the third sacrificial layer 420 may include, for example, a nitride such as silicon nitride.

The second opening 445 may be formed in various layouts in a plan view. For example, a plurality of second openings 445 may be spaced apart from each other in second and third directions D2 and D3 in the first region I of the second substrate 400. Additionally, the second opening 445 may extend in the second direction D2 or the third direction D3 on a boundary between first and second regions I and II of the second substrate 400. Furthermore, a plurality of second openings 445, each of which may extend in the third direction D3, may be spaced apart from each other in the second direction D2 in the second region II of the second substrate 400. FIG. 24 exemplarily shows the second opening 445 extending in the second direction D2 on the boundary between the first and second regions I and II of the second substrate 400.

The support layer 450 may include a material having an etching selectivity with respect to the second to fourth sacrificial layers 410, 420 and 430, for example, polysilicon doped with n-type impurities. The support layer 450 may be conformally formed, and thus, a second recess may be formed on a portion of the support layer 450 in the second opening 445. The portion of the support layer 450 in the second opening 445 may be referred to as a support pattern.

A second insulation layer 460 and a fifth sacrificial layer 470 may be alternately and repeatedly stacked on the support layer 450 in the first direction D1, and thus, a second mold layer including the second insulation layers 460 and the fifth sacrificial layers 470 may be formed. The second insulation layer 460 may include an oxide, e.g., silicon oxide, and the fifth sacrificial layer 470 may include a material having an etching selectivity with respect to the second insulation layer 460, for example, a nitride such as nitride silicon.

FIGS. 23 and 24 show that the second mold layer includes the second insulation layers 460 and the fifth sacrificial layers 470 stacked at 14 levels and 13 levels, respectively. However, embodiments of the inventive concept are not limited thereto, and the second insulation layers 460 and the fifth sacrificial layers 470 may be respectively formed at more levels according to embodiments.

A photoresist layer may be formed on an uppermost one of the second insulation layers 460, a photo process may be performed on the photoresist layer to form a photoresist pattern, and the uppermost one of the second insulation layers 460 and an uppermost one of the fifth sacrificial layers 470 may be etched using the photoresist pattern as an etching mask. Accordingly, a portion of one of the second insulation layers 460 disposed directly under the uppermost one of the fifth sacrificial layers 470 may be exposed. After performing a trimming process for reducing an area of the photoresist pattern, the uppermost one of the second insulation layers 460, the uppermost one of the fifth sacrificial layers 470, the exposed one of second insulation layers 460 and one of the fifth sacrificial layer 470 directly disposed under the exposed one of the second insulation layers 460 may be etched by an etching process using the reduced photoresist pattern as an etching mask.

The trimming process and the etching process may be repeatedly performed to form a second mold having a staircase shape and including a plurality of step layers each of which may include a single fifth sacrificial layer 470 and a single second insulation layer 460 sequentially stacked in the first and second regions I and II of the second substrate 400. An end portion of each of the step layers in the third direction D3 may be exposed without being overlapped in the first direction D1 by upper step layers, which may be referred to as a "step". In example embodiments, the steps of the second mold may be formed in the second region II of the second substrate 400, and may be arranged in the third direction D3 and/or the second direction D2.

In an example embodiment, an upper surface of an edge portion of the support layer 450 is not covered by the second mold, but rather, may be exposed.

Figure 25:
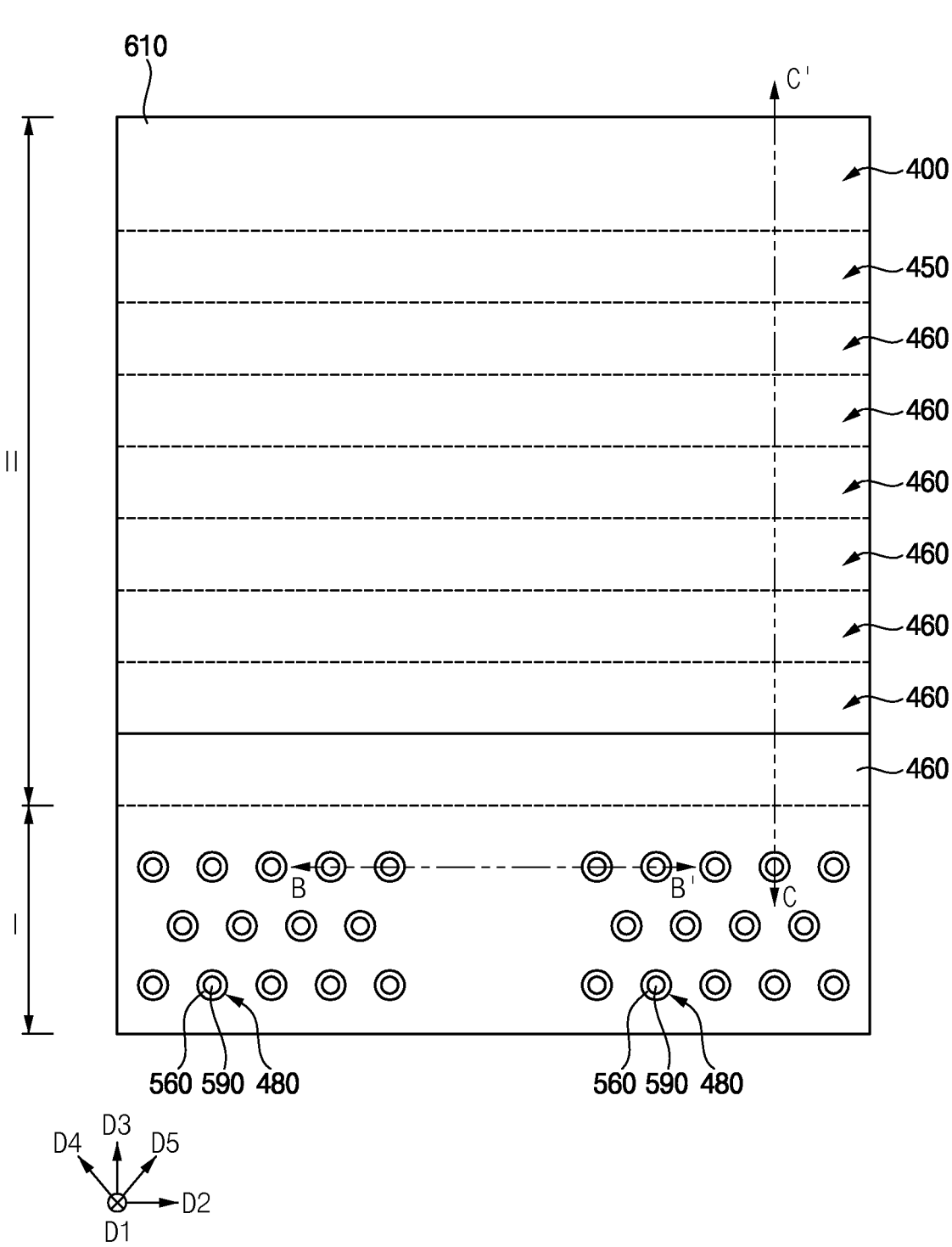
Figure 26:
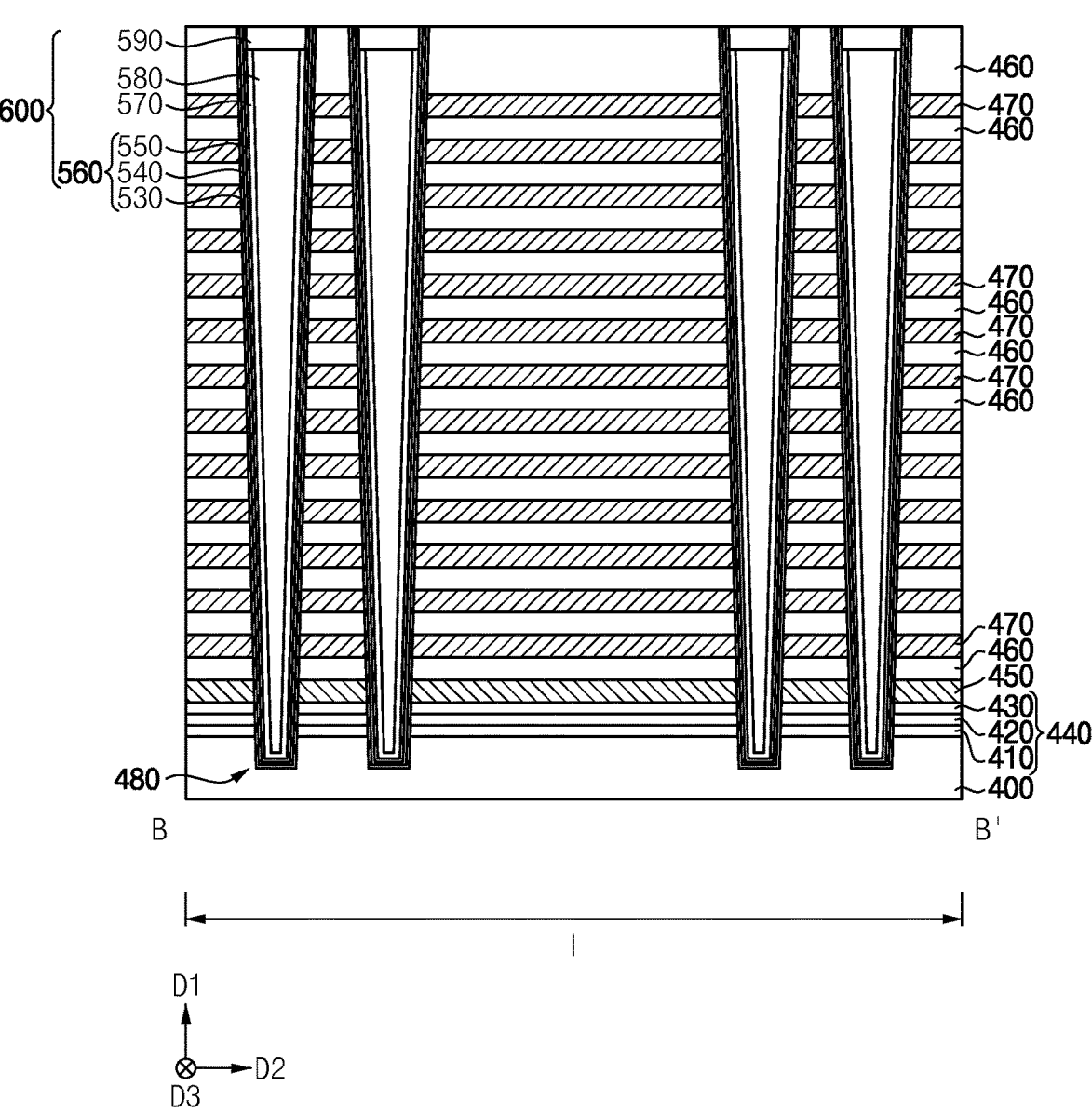

Referring to FIGS. 25 to 27, after forming a fifth insulating interlayer 610 covering the second mold, the support layer 450 and the sacrificial layer structure 440 on the second substrate 400, the fifth insulating interlayer 610 may be planarized until an upper surface of the uppermost one of second insulation layers 460 included in the second mold is exposed, and thus, a sidewall of the second mold, the exposed upper surface and a sidewall of the support layer 450, and a sidewall of the sacrificial layer structure 440 may be covered by the fifth insulating interlayer 610.

A sixth hole 480 may be formed through the second mold, the support layer 450 and the sacrificial layer structure 440 to expose the upper surface of the second substrate 400, a second charge storage layer structure may be formed on a sidewall of the sixth hole 480, the upper surface of the second substrate 400 exposed by the sixth hole 480, the uppermost one of the second insulation layers 460 in the second mold and the fifth insulating interlayer 610, a second channel layer may be formed on the second charge storage layer structure, and a second filling layer may be formed on the second channel layer to fill the sixth hole 480.

The second charge layer, the second channel layer and the second charge storage layer structure may be planarized until the upper surface of the uppermost one of the second insulation layers 460 in the second mold is exposed, and thus, a second filling pattern 580, a second channel 570 and a second charge storage structure 560 may be formed in the sixth hole 480. The second charge storage structure 560 may include a third blocking pattern 530, a second charge storage pattern 540 and a second tunnel insulation pattern 550 sequentially stacked from the sidewall of the sixth hole 480 and the upper surface of the second substrate 400.

Upper portions of the second channel 570 and the second filling pattern 580 may be removed to form a third recess, and a second capping pattern 590 may be formed to fill the third recess. The second charge storage structure 560, the second channel 570, the second filling pattern 580 and the second capping pattern 590 may collectively form a second memory channel structure 600. In example embodiments, a plurality of second memory channel structures 600 may be spaced apart from each other in the second and third directions D2 and D3 in the first region I of the second substrate 400 to define a second memory channel structure array.

The second memory channel structure array may include a plurality of second memory channel structure rows spaced apart from each other in the third direction D3, and each of the second memory channel structure rows may include a plurality of second memory channel structures 600 spaced apart from each other in the second direction D2. Additionally, the second memory channel structure array may include a plurality of second memory channel structure columns spaced apart from each other in the second direction D2, and each of the second memory channel structure columns may include a plurality of second memory channel structures 600 spaced apart from each other in the fourth direction D4.

In an example embodiment, each of the second memory channel structures 600 may have a width gradually decreasing from an upper portion toward a lower portion thereof.

Referring to FIGS. 28 to 30, processes substantially the same as or similar to those of FIG. 11 may be performed, so that a seventh hole 900 may be formed to extend through a portion of the second mold between neighboring ones of the second memory channel structures 600 in the fourth direction D4 in each of the second memory channel structure columns, and the second charge storage structure 560 and the second channel 570 in each of the second memory channel structures 600 in the first region I of the second substrate 400.

Accordingly, a single second memory channel structure 600 in the vertical memory device may include two second charge storage structures 560 divided in the fifth direction D5 and two second channels 570 divided in the fifth direction D5.

In example embodiments, a plurality of seventh holes 900 may be spaced apart from each other in the fourth direction D4 to form a seventh hole column, and a plurality of seventh hole columns may be spaced apart from each other in two directions D2 to define a seventh hole array.

In example embodiments, the seventh hole 900 may have a shape of, e.g., a circle, an ellipse, a polygon, a polygon with rounded vertices, etc., in a plan view.

A sixth division layer 910 may be formed to fill the seventh hole 900 on the second substrate 400. The sixth division layer 910 may contact sidewalls of the second filling pattern 580 and the second capping pattern 590.

As the seventh holes 900, in which the sixth division layers 910 are respectively formed, define the seventh hole array, the sixth division layers 910 may also define a sixth division layer array.

The sixth division array may include a plurality of sixth division layer rows spaced apart from each other in the third direction D3, and each of the sixth division layer rows may include a plurality of sixth division layers 910 spaced apart from each other in the third direction D3. Additionally, the sixth division layer array may include a plurality of sixth division layer columns spaced apart from each other in the second direction D2, and each of the sixth division layer columns may include a plurality of sixth division layers 910 spaced apart from each other in the fourth direction D4.

Figure 31:
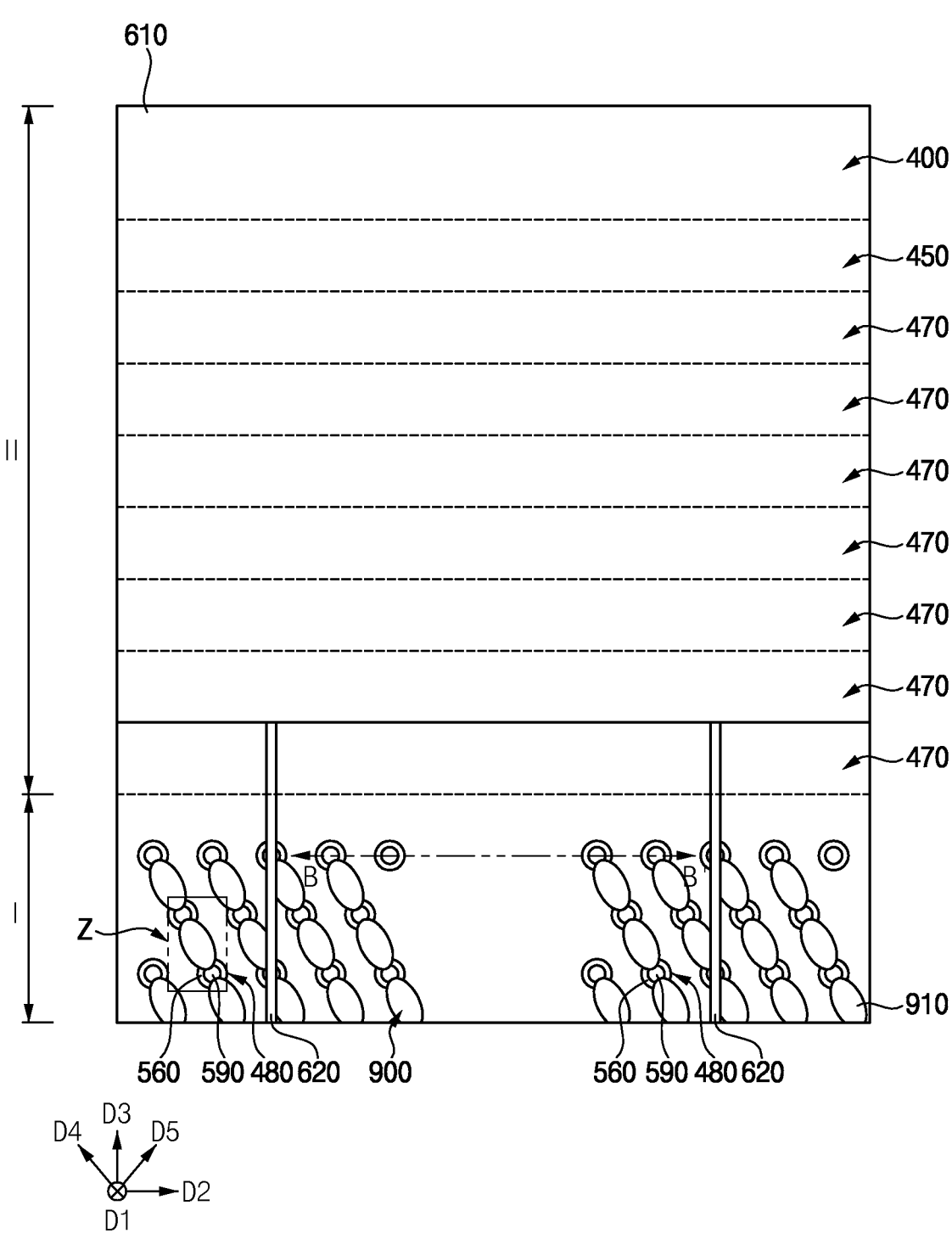

Referring to FIG. 31, portions of the fifth insulating interlayer 610, the second insulation layers 460 and the fifth sacrificial layers 470 may be etched to form a third opening extending therethrough in the third direction D3, and a seventh division layer 620 may be formed to fill the third opening.

The seventh division layer 620 may extend in the third direction D3 in the first and second regions I and II of the second substrate 400, and may extend through, for example, upper two step layers included in the second mold. Thus, the fifth sacrificial layers 470 at the upper two step layers included in the second mold may be divided from each other in the second direction D2 by the seventh division layer 620. In an example embodiment, the seventh division layer 620 may extend through a portion of some of the second memory channel structures 600.

Figure 32:
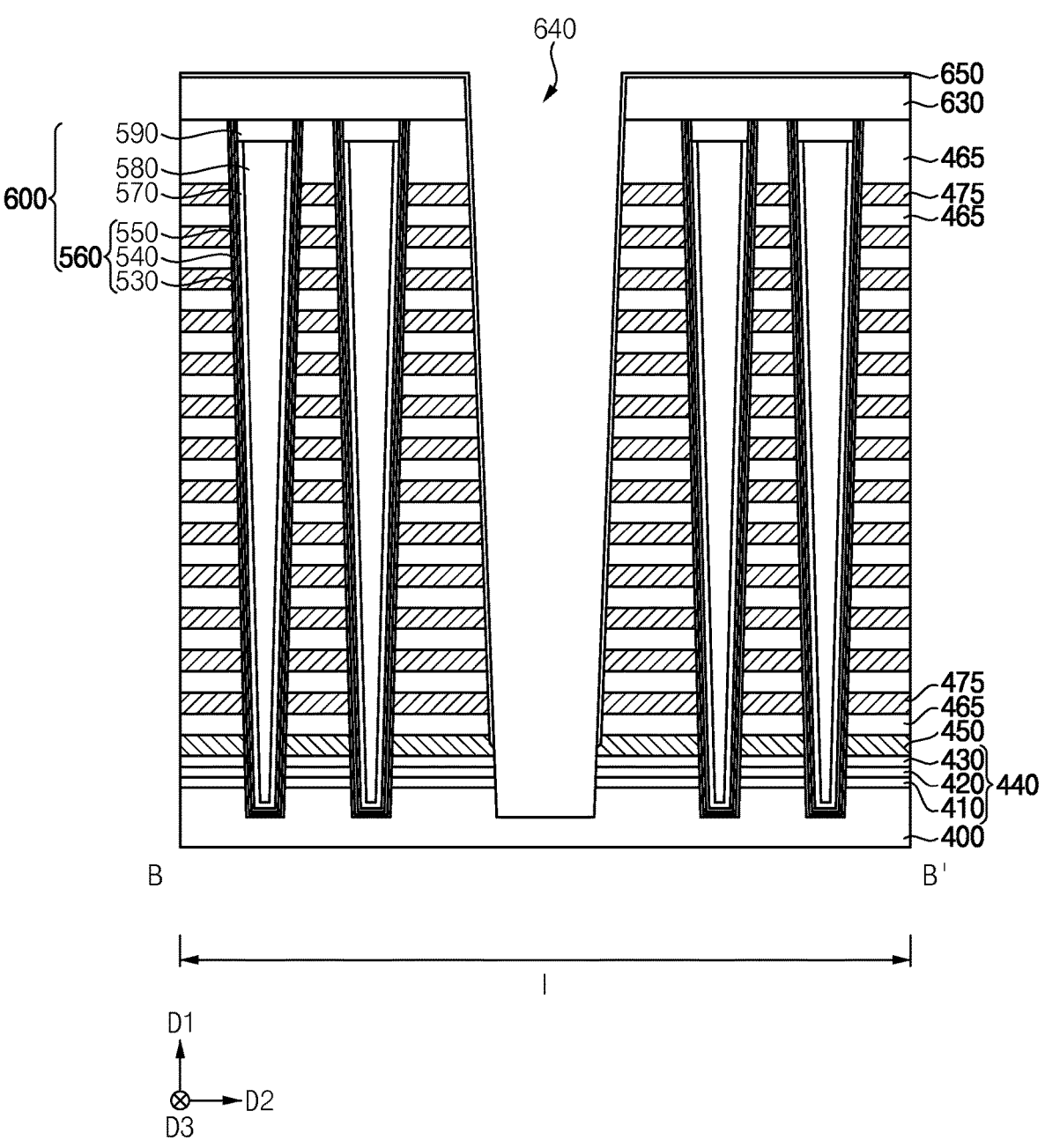

Referring to FIG. 32, after forming a sixth insulating interlayer 630 on the fifth insulating interlayer 610 and the seventh division layer 620, a fourth opening 640 may be formed through the fifth and sixth insulating interlayers 610 and 630 and the second mold on the second substrate 400 by, for example, a dry etching process.

The dry etching process may be performed until the fourth opening 640 exposes an upper surface of the support layer 450 or the support pattern, and further, may extend through an upper portion of the support layer 450 or the support pattern. In example embodiments, the fourth opening 640 may extend in the third direction D3 in the first and second regions I and II of the second substrate 400, and a plurality of fourth openings 640 may be spaced apart from each other in the second direction D2. As the fourth opening 640 is formed, the second insulation layer 460 in the second mold may be divided into a plurality of second insulation patterns 465, each of which may extend in the third direction D3, and the fifth sacrificial layer 470 may be divided into a plurality of fifth sacrificial patterns 475, each of which may extend in the third direction D3.

After forming a spacer layer on a sidewall of the fourth opening 640 and an upper surface of the sixth insulating interlayer 630, a portion of the spacer layer on a bottom of the fourth opening 640 may be removed by an anisotropic etching process to form a spacer 650. Thus, upper surfaces of the support layer 450 and the support pattern may be partially exposed.

Portions of the exposed support layer 450 and the support pattern and a portion of the sacrificial layer structure 440 thereunder may be removed to enlarge the fourth opening 640 downwardly. Accordingly, the fourth opening 640 may expose the upper surface of the second substrate 400, and further, may extend through an upper portion of the second substrate 400.

In example embodiments, the spacer 650 may include, e.g., an undoped amorphous silicon or undoped polysilicon.

In an example embodiment, when the sacrificial layer structure 440 is partially removed, a sidewall of the fourth opening 640 may be covered by the spacer 650, so that the second insulation pattern 465 and the fifth sacrificial pattern 475 in the second mold are not removed.

Figure 33:
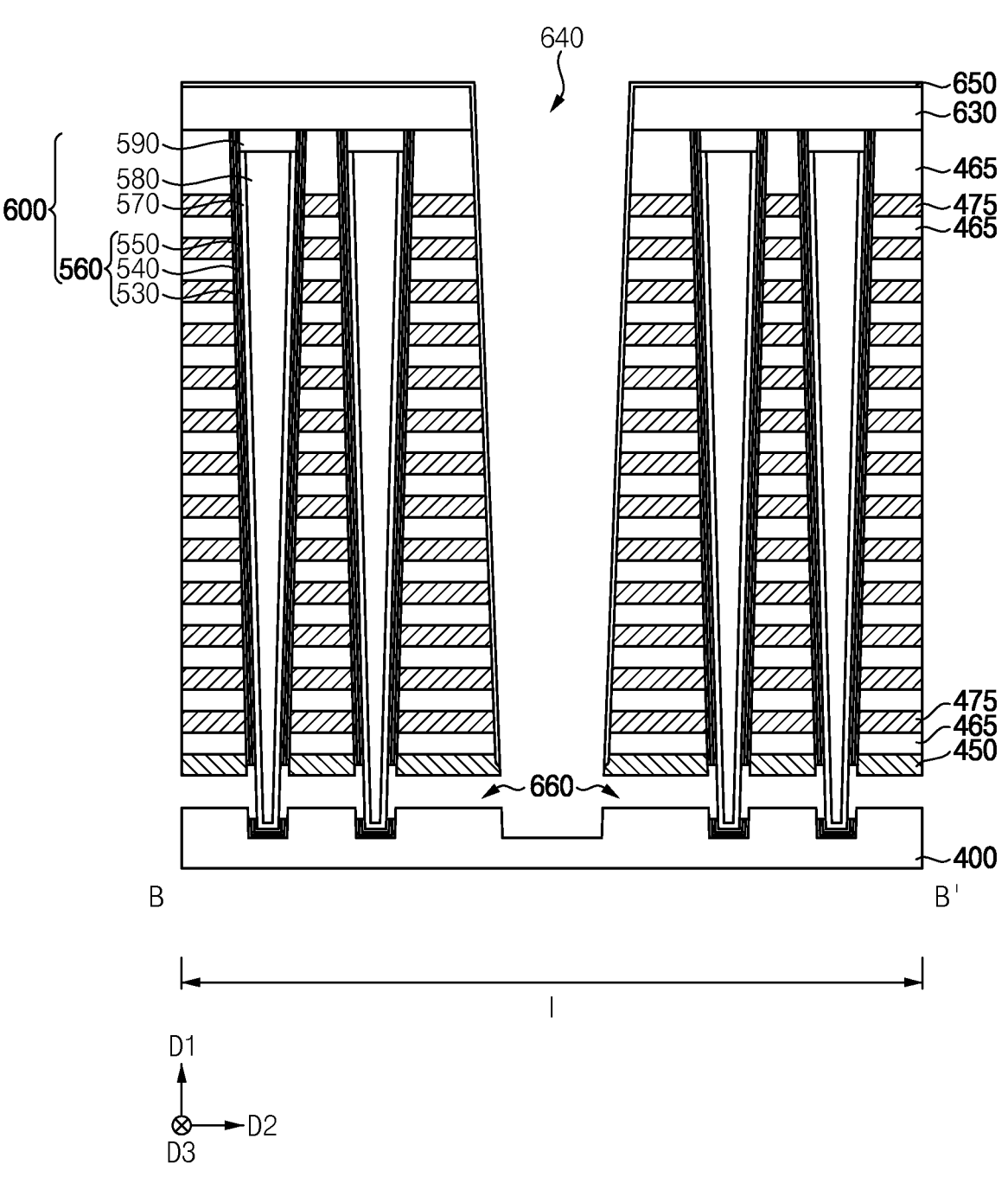

Referring to FIG. 33, the sacrificial layer structure 440 may be removed through the fourth opening 640 by, for example, a wet etching process, and thus, a second gap 660 may be formed.

In example embodiments, the wet etching process may be performed using, for example, hydrofluoric acid (HF) and/or phosphoric acid ($H_3PO_4$).

As the second gap 660 is formed, a lower portion of the support layer 450 disposed adjacent to the fourth opening 640 and the upper portion of the second substrate 400 may be exposed. In addition, a portion of a sidewall of the second charge storage structure 560 may be exposed by the second gap 660, and the exposed lateral portion of the second charge storage structure 560 may also be removed by the wet etching process to expose an outer sidewall of the channel 570. Thus, the second charge storage structure 560 may be separated into an upper portion, which may extend through the second mold to cover most of the outer sidewall of the second channel 570, and a lower portion, which may be formed on the upper surface of the second substrate 400 and cover a bottom surface of the second channel 570.

In an example embodiment, during the formation of the second gap 660 by the wet etching process, the support layer 450 and the support pattern are not removed, and thus, the second mold does not collapse.

Figure 34:
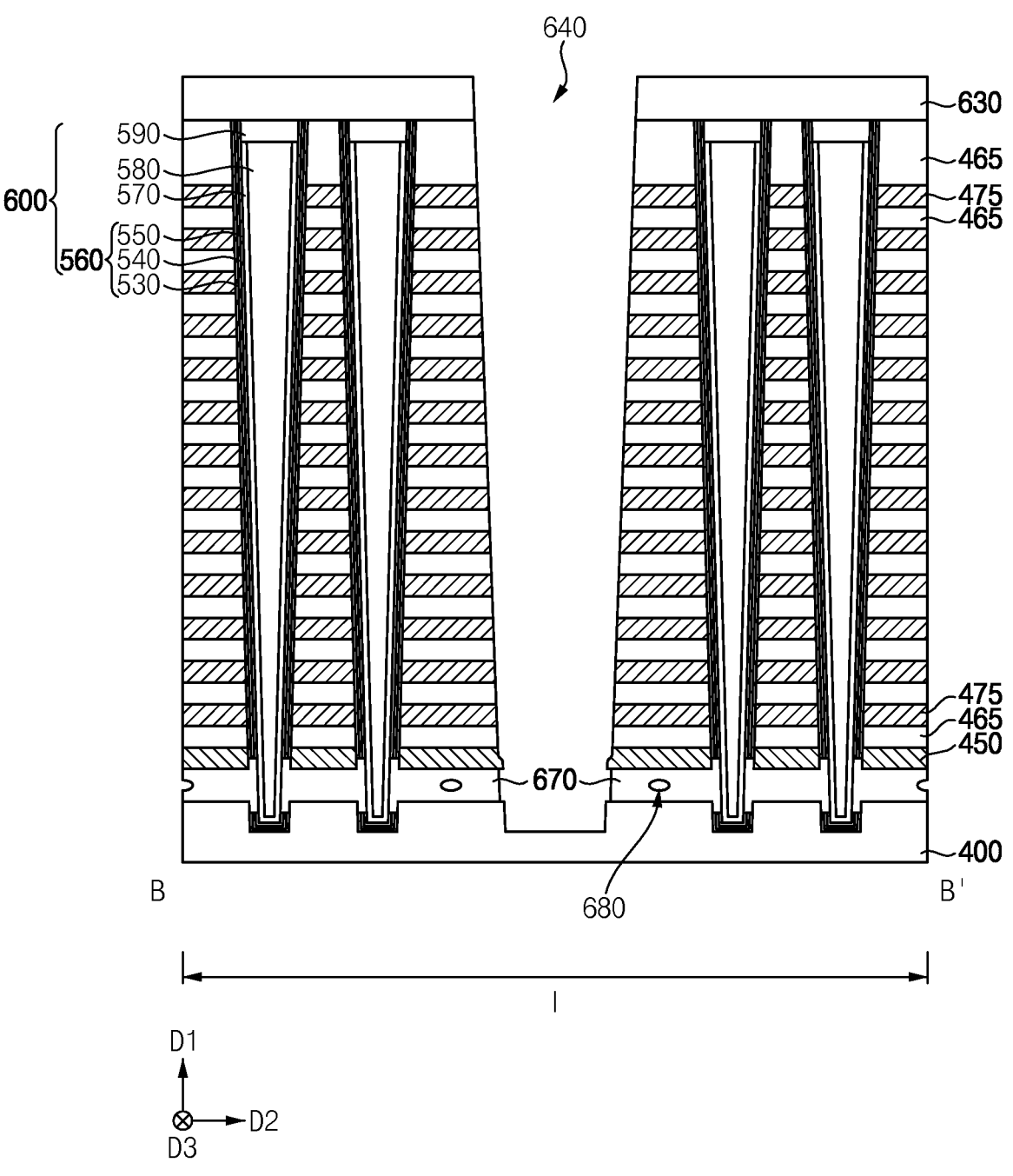

Referring to FIG. 34, the spacer 650 may be removed, a channel connection layer may be formed on the sidewall of the fourth opening 640 and in the second gap 660, and a portion of the channel connection layer in the fourth opening 640 may be removed by, e.g., an etch-back process to form a channel connection pattern 670 in the second gap 660.

As the channel connection pattern 670 is formed, ones of the second channels 570 between ones of the fourth openings 640 disposed adjacent to each other in the second direction D2 in the first region I of the second substrate 400 may be connected to each other.

In some embodiments, a second air gap 680 may be formed in the channel connection pattern 670.

Figure 35:
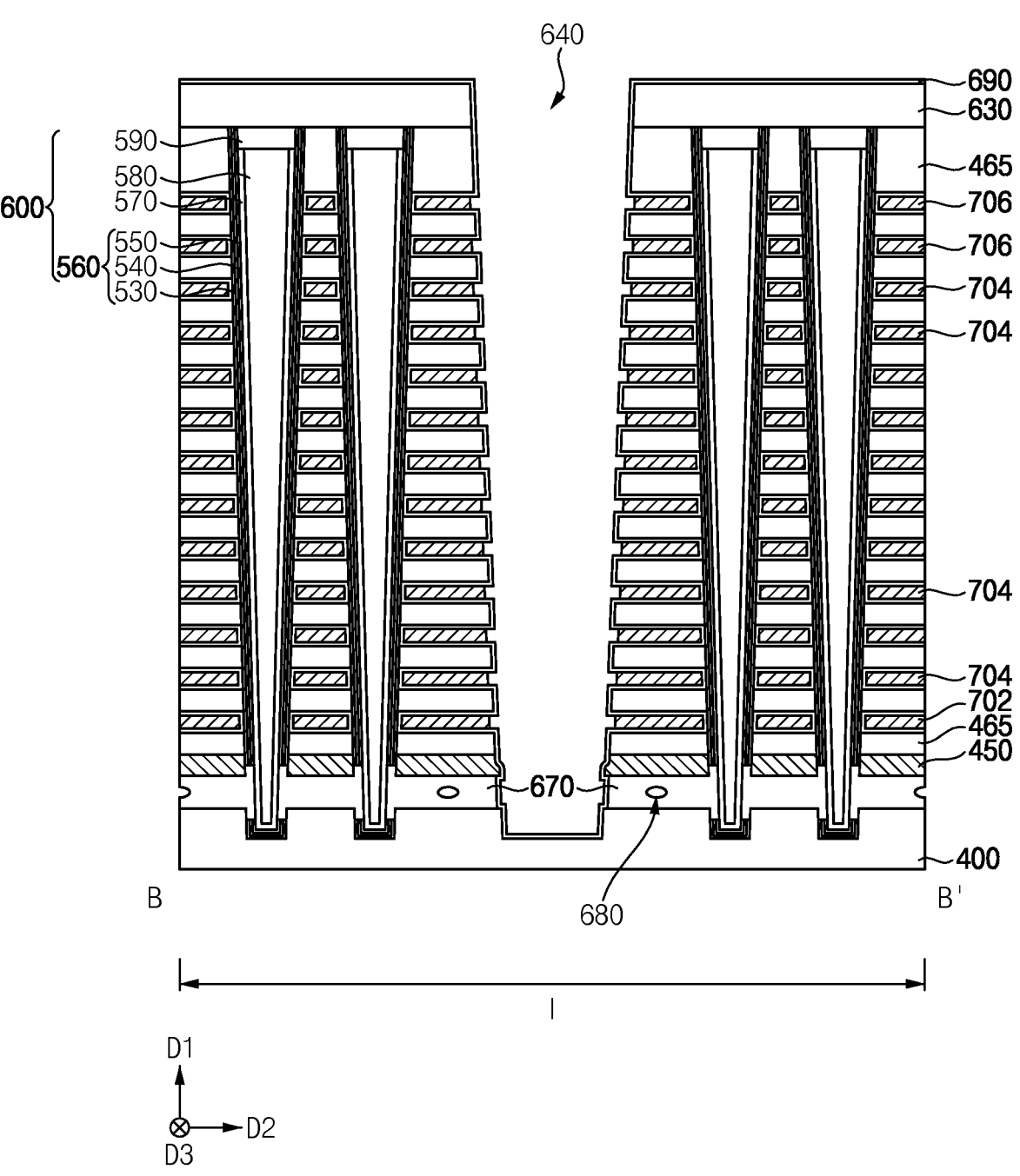

Referring to FIG. 35, the fifth sacrificial patterns 475 exposed by the fourth opening 640 may be removed to form third gaps between the second insulation patterns 465 at respective levels, and a portion of an outer sidewall of the third blocking pattern 530 may be exposed by each of the third gaps.

In example embodiments, the fifth sacrificial patterns 475 may be removed by a wet etching process using phosphoric acid ($H_3PO_4$) or sulfuric acid ($H_2SO_4$).

A fourth blocking layer 690 may be formed on the exposed outer sidewall of the third blocking pattern 530, inner walls of the third gaps, surfaces of the second insulation patterns 465, a sidewall and a portion of a bottom surface of the support layer 450, a sidewall of the support pattern, a sidewall of the channel connection pattern 670, the upper surface of the second substrate 400 and the upper surface of the sixth insulating interlayer 630, and a second gate electrode layer may be formed on the fourth blocking layer 690.

The second gate electrode layer may include a second gate conductive layer and a second gate barrier layer covering upper and lower surfaces and a portion of sidewall of the second gate conductive layer.

The second gate electrode layer may be partially removed to form a second gate electrode in each of the third gaps. In example embodiments, the second gate electrode may extend in the third direction D3, and a plurality of second gate electrodes may be stacked in a plurality of levels, respectively, spaced apart from each other in the first direction D1 to form a second gate electrode structure. The second gate electrodes may be stacked in a staircase shape in which an extension length in the second direction D2 decreases from a lowermost level to an uppermost level in a stepwise manner. Additionally, a plurality of second gate electrode structures may be spaced apart from each other in the second direction D2 by the fourth opening 640.

The second gate electrode structure may include third to fifth gate electrodes 702, 704 and 706 sequentially stacked in the first direction D1.

Referring back to FIGS. 17 to 21, after forming an eighth division layer 710 to sufficiently fill a remaining portion of the fourth opening 640 on the fourth blocking layer 690, the eighth division layer 710 may be planarized until the upper surface of the sixth insulating interlayer 630 is exposed. During the planarization process, a portion of the fourth blocking layer 690 disposed on the upper surface of the sixth insulating interlayer 630 may be removed, and a remaining portion of the fourth blocking layer 690 may form a fourth blocking pattern 695.

The eighth division layer 710 may extend in the third direction D3 in the first and second regions I and II of the second substrate 400, and a plurality of eight division layers may be spaced apart from each other in the second direction D2.

A seventh insulating interlayer 720 may be formed on the sixth insulating interlayer 630, the eighth division layer 710 and the fourth blocking pattern 695. Second contact plugs 732 extending through the fifth to seventh insulating interlayers 610, 630 and 720, the second insulation pattern 465 and the fourth blocking pattern 695 to contact a corresponding one of the third to fifth gate electrodes 702, 704 and 706, a third contact plug 734 extending through the fifth to seventh insulating interlayers 610, 630 and 720 to contact the upper surface of the second substrate 400, and fourth contact plugs 736 extending through the sixth and seventh insulating interlayers 630 and 720 to contact a corresponding one of the second capping patterns 590 may be formed. In example embodiments, each of the second to fourth contact plugs 732, 734 and 736 may have a width that gradually decreases from a top to a bottom thereof.

After forming an eighth insulating interlayer 740 on the seventh insulating interlayer 720, first to third wirings 752, 754 and 756 may be formed through the eighth insulating interlayer 740 to contact the second to fourth contact plugs 732, 734 and 736, respectively. The layouts of the second to fourth contact plugs 732, 734 and 736 and the first to third wirings 752, 754 and 756 shown in FIG. 17 are an example, and example embodiments of the inventive concept are not limited thereto.

In example embodiments, the third wiring 756 may extend in the second direction D2 in the first region I of the second substrate 400, and a plurality of third wirings 756 may be spaced apart from each other in the third direction D3. Each of the third wirings 756 may serve as a bit line of the vertical memory device.

The vertical memory device may be manufactured by performing the above processes.

While the inventive concept has been particularly shown and described with reference to embodiments thereof, it will be understood by those of ordinary skill in the art that various changes in form and detail may be made therein without departing from the spirit and scope of the inventive concept as defined by the following claims.

What is claimed is:

1. A vertical memory device, comprising:
a memory channel structure disposed on a substrate and extending in a vertical direction substantially perpendicular to an upper surface of the substrate;
a plurality of division layers disposed on the substrate and contacting the memory channel structure; and
a gate electrode structure contacting a sidewall of the memory channel structure and sidewalls of the plurality of division layers,
wherein the memory channel structure comprises:
a filling pattern;
a channel disposed on a sidewall of the filling pattern; and
a charge storage structure disposed on an outer sidewall of the channel, and
wherein each of the plurality of division layers extends through a portion of the charge storage structure and a portion of the channel, and each of the charge storage structure and the channel is divided into two parts by the plurality of division layers.

2. The vertical memory device according to claim 1, wherein each of the plurality of division layers has a shape selected from the group consisting of a circle, an ellipse, a polygon, and a polygon with rounded vertices in a plan view.

3. The vertical memory device according to claim 2, wherein each of the plurality of division layers has a shape of a first circle and a portion of a second circle, the first circle has a first radius, the second circle has a second radius smaller than the first radius, and the portion of the second circle protrudes outwardly from the first circle in the plan view.

4. The vertical memory device according to claim 1, wherein the memory channel structure is one of a plurality of memory channel structures spaced apart from each other in a first direction substantially parallel to the upper surface of the substrate,
wherein each of the plurality of division layers is disposed between neighboring ones of the plurality of memory channel structures, and the plurality of division layers are spaced apart from each other in the first direction, and
wherein the gate electrode structure contacts sidewalls of the plurality of memory channel structures and the sidewalls of the plurality of division layers, and extends in the first direction.

5. The vertical memory device according to claim 4, wherein the gate electrode structure comprises:
a first gate electrode structure contacting first sidewalls of the plurality of memory channel structures and first sidewalls of the plurality of division layers; and
a second gate electrode structure contacting second sidewalls of the plurality of memory channel structures and second sidewalls of the plurality of division layers.

6. The vertical memory device according to claim 1, wherein the gate electrode structure comprises a plurality of gate electrodes spaced apart from each other in the vertical direction.

7. The vertical memory device according to claim 1, wherein the charge storage structure comprises:
a tunnel insulation pattern, a charge storage pattern and a blocking pattern sequentially stacked from an outer wall of the channel in a horizontal direction substantially parallel to the upper surface of the substrate.

8. A vertical memory device, comprising:
a memory channel structure disposed on a substrate and extending in a vertical direction substantially perpendicular to an upper surface of the substrate;
a division layer disposed on the substrate and contacting the memory channel structure; and
a gate electrode structure contacting a sidewall of the memory channel structure and a sidewall of the division layer,
wherein:
the memory channel structure comprises:
a filling pattern;
a channel disposed on a sidewall of the filling pattern; and
a charge storage structure disposed on an outer sidewall of the channel,
the charge storage structure comprises a tunnel insulation pattern, a charge storage pattern and a blocking pattern sequentially stacked from the outer sidewall of the channel in a horizontal direction substantially parallel to the upper surface of the substrate,
the division layer extends through a portion of the blocking pattern and contacts the charge storage pattern, and
the charge storage pattern comprises an air gap including air at a portion of the charge storage pattern contacting the division layer.

9. The vertical memory device according to claim 8, wherein the tunnel insulation pattern comprises an oxide or oxynitride, the blocking pattern comprises an oxide, and the charge storage pattern comprises an insulating nitride.

10. The vertical memory device according to claim 8, wherein the division layer is one of two division layers disposed at opposite sides of the memory channel structure, and the two division layers divide the blocking pattern into two parts.

11. The vertical memory device according to claim 8, wherein the division layer has a shape selected from the group consisting of a circle, an ellipse, a polygon, and a polygon with rounded vertices in a plan view.

12. The vertical memory device according to claim 8, wherein the memory channel structure is one of a plurality of memory channel structures spaced apart from each other in a first direction substantially parallel to the upper surface of the substrate,
wherein the division layer is one of a plurality of division layers, each of the plurality of division layers is disposed between neighboring ones of the plurality of memory channel structures, and the plurality of division layers are spaced apart from each other in the first direction, and
wherein the gate electrode structure contacts sidewalls of the plurality of memory channel structures and sidewalls of the plurality of division layers, and extends in the first direction.

13. The vertical memory device according to claim 12, wherein the gate electrode structure comprises:
a first gate electrode structure contacting first sidewalls of the plurality of memory channel structures and first sidewalls of the plurality of division layers; and
a second gate electrode structure contacting second sidewalls of the plurality of memory channel structures and second sidewalls of the plurality of division layers.

14. The vertical memory device according to claim 8, wherein the gate electrode structure comprises a plurality of gate electrodes spaced apart from each other in the vertical direction.

15. A vertical memory device, comprising:

a memory channel structure disposed on a substrate and extending in a vertical direction substantially perpendicular to an upper surface of the substrate;

a plurality of division layers disposed on the substrate and contacting the memory channel structure; and a gate electrode structure contacting a sidewall of the memory channel structure and sidewalls of the plurality of division layers, wherein:

the memory channel structure comprises:

a filling pattern;

a channel disposed on a sidewall of the filling pattern; and a charge storage structure disposed on an outer sidewall of the channel, the charge storage structure comprises a tunnel insulation pattern, a charge storage pattern and a blocking pattern sequentially stacked from the outer sidewall of the channel in a horizontal direction substantially parallel to the upper surface of the substrate, each of the plurality of division layers extends through a portion of the blocking pattern, and the blocking pattern is divided into two parts by the plurality of division layers, and each of the plurality of division layers has a shape selected from the group consisting of a circle and an ellipse in a plan view.

16. The vertical memory device according to claim 15, wherein the memory channel structure is one of a plurality of memory channel structures spaced apart from each other in a first direction substantially parallel to the upper surface of the substrate, wherein each of the plurality of division layers is disposed between neighboring ones of the plurality of memory channel structures, and the plurality of division layers are spaced apart from each other in the first direction, and wherein the gate electrode structure contacts sidewalls of the plurality of memory channel structures and the sidewalls of the plurality of division layers, and extends in the first direction.

17. The vertical memory device according to claim 16, wherein a structure including the plurality of memory channel structures and the plurality of division layers extends continuously in the first direction.

18. The vertical memory device according to claim 16, wherein the gate electrode structure comprises:

a first gate electrode structure contacting first sidewalls of the plurality of memory channel structures and first sidewalls of the plurality of division layers; and a second gate electrode structure contacting second sidewalls of the plurality of memory channel structures and second sidewalls of the plurality of division layers.

19. The vertical memory device according to claim 15, wherein the gate electrode structure comprises a plurality of gate electrodes spaced apart from each other in the vertical direction.

20. The vertical memory device according to claim 15, wherein each of the tunnel insulation pattern and the blocking pattern comprises an oxide, and the charge storage pattern comprises an insulating nitride.

* * * * *